(12) United States Patent
Matsuo et al.

(10) Patent No.: US 10,600,896 B2
(45) Date of Patent: Mar. 24, 2020

(54) SEMICONDUCTOR DEVICE AND METHOD FOR PRODUCING THE SAME

(71) Applicant: Renesas Electronics Corporation, Koutou-ku, Tokyo (JP)

(72) Inventors: Takamitsu Matsuo, Hitachinaka (JP); Hitoshi Matsuura, Hitachinaka (JP); Yasuyuki Saito, Hitachinaka (JP); Yoshinori Hoshino, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/700,337

(22) Filed: Sep. 11, 2017

(65) Prior Publication Data

US 2018/0076308 A1 Mar. 15, 2018

(30) Foreign Application Priority Data

Sep. 12, 2016 (JP) .................. 2016-177746

(51) Int. Cl.
*H01L 29/739* (2006.01)
*H01L 29/10* (2006.01)
(Continued)

(52) U.S. Cl.
CPC ...... *H01L 29/7397* (2013.01); *H01L 29/0619* (2013.01); *H01L 29/1095* (2013.01);
(Continued)

(58) Field of Classification Search
None
See application file for complete search history.

(56) References Cited

U.S. PATENT DOCUMENTS

| 5,894,149 A | 4/1999 | Uenishi et al. |
| 2007/0178702 A1 | 8/2007 | Matsumura et al. |

(Continued)

FOREIGN PATENT DOCUMENTS

| EP | 3 147 950 A1 | 3/2017 |
| JP | 2005-057028 A | 3/2005 |

(Continued)

OTHER PUBLICATIONS

Extended European Search Report dated Jan. 26, 2018, in European Patent Application No. EP17190374.3.

(Continued)

*Primary Examiner* — Thien F Tran
(74) *Attorney, Agent, or Firm* — SGPatents PLLC

(57) ABSTRACT

In an active region, a gate electrode is disposed in a trench. Spaced apart from the gate electrode, an emitter electrode is disposed in the trench. A source diffusion layer and a base diffusion layer are formed in the active region. The base diffusion layer has a base bottom portion inclined in such a manner that a portion of the base bottom portion adjacent to the emitter electrode is positionally deeper than a portion of the base bottom portion adjacent to the gate electrode. A contact portion has a contact bottom portion inclined in such a manner that a portion of the contact bottom portion in contact with the emitter electrode is positionally deeper than a portion of the contact bottom portion in contact with the base diffusion layer.

9 Claims, 25 Drawing Sheets

(51) Int. Cl.
  *H01L 29/40* (2006.01)
  *H01L 29/66* (2006.01)
  *H01L 29/06* (2006.01)
  *H01L 29/423* (2006.01)
(52) U.S. Cl.
  CPC ........ *H01L 29/407* (2013.01); *H01L 29/4236* (2013.01); *H01L 29/42376* (2013.01); *H01L 29/6634* (2013.01); *H01L 29/66348* (2013.01); *H01L 29/7396* (2013.01); *H01L 29/0696* (2013.01)

(56) References Cited

U.S. PATENT DOCUMENTS

| | | |
|---|---|---|
| 2011/0018029 A1 | 1/2011 | Pfirsch et al. |
| 2013/0164895 A1 | 6/2013 | Zeng et al. |
| 2013/0175574 A1 | 7/2013 | Matsuura |
| 2014/0027813 A1* | 1/2014 | Kuruc ............... H01L 29/66348 257/139 |
| 2014/0054644 A1 | 2/2014 | Hikasa |
| 2014/0057424 A1 | 2/2014 | Masuda et al. |
| 2014/0077256 A1* | 3/2014 | Hikasa ............. H01L 29/66348 257/139 |
| 2014/0097466 A1 | 4/2014 | Torii |
| 2015/0041962 A1 | 2/2015 | Laven et al. |
| 2016/0359026 A1* | 12/2016 | Matsuura ............ H01L 29/7397 |
| 2017/0092750 A1 | 3/2017 | Nagata |

FOREIGN PATENT DOCUMENTS

| | | |
|---|---|---|
| JP | 2007-074006 A | 3/2007 |
| JP | 2007-207930 A | 8/2007 |
| JP | 2013-140885 A | 7/2013 |
| JP | 2014-041945 A | 3/2014 |
| JP | 2014-075483 A | 4/2014 |

OTHER PUBLICATIONS

Extended European Search Report dated Feb. 14, 2019, in European Patent Application No. 18211862.0.
Office Action dated Jan. 7, 2020, in Japanese Patent Application No. 2016-177746.

* cited by examiner

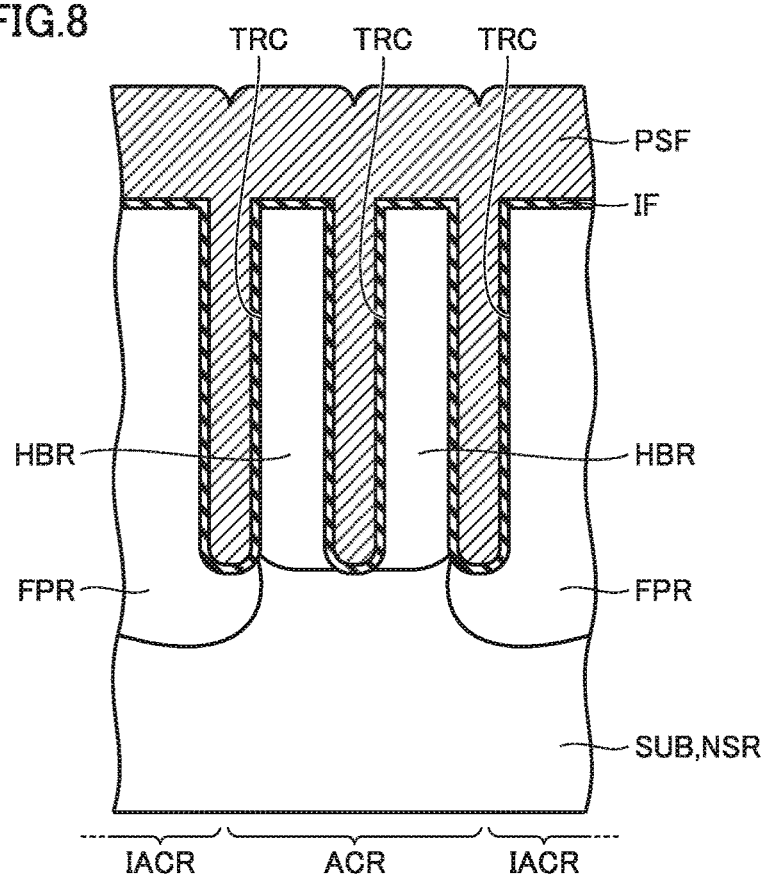
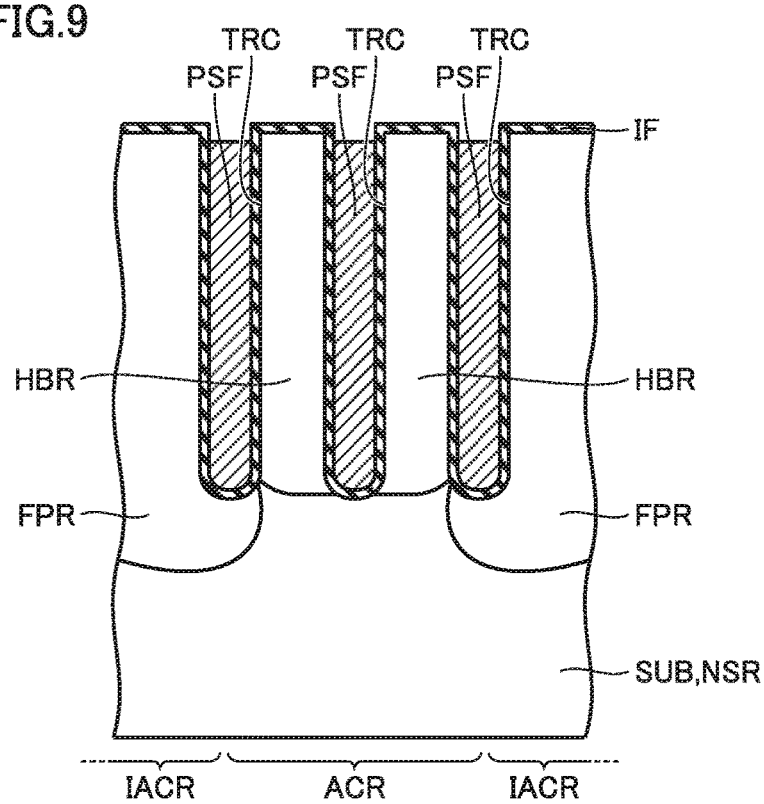

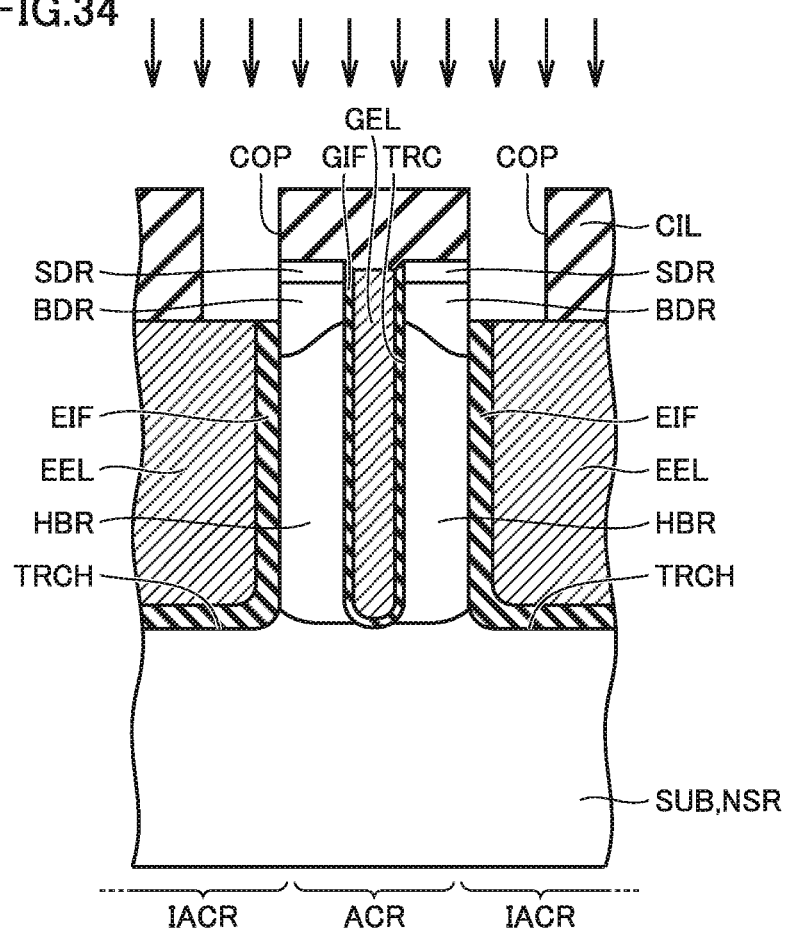

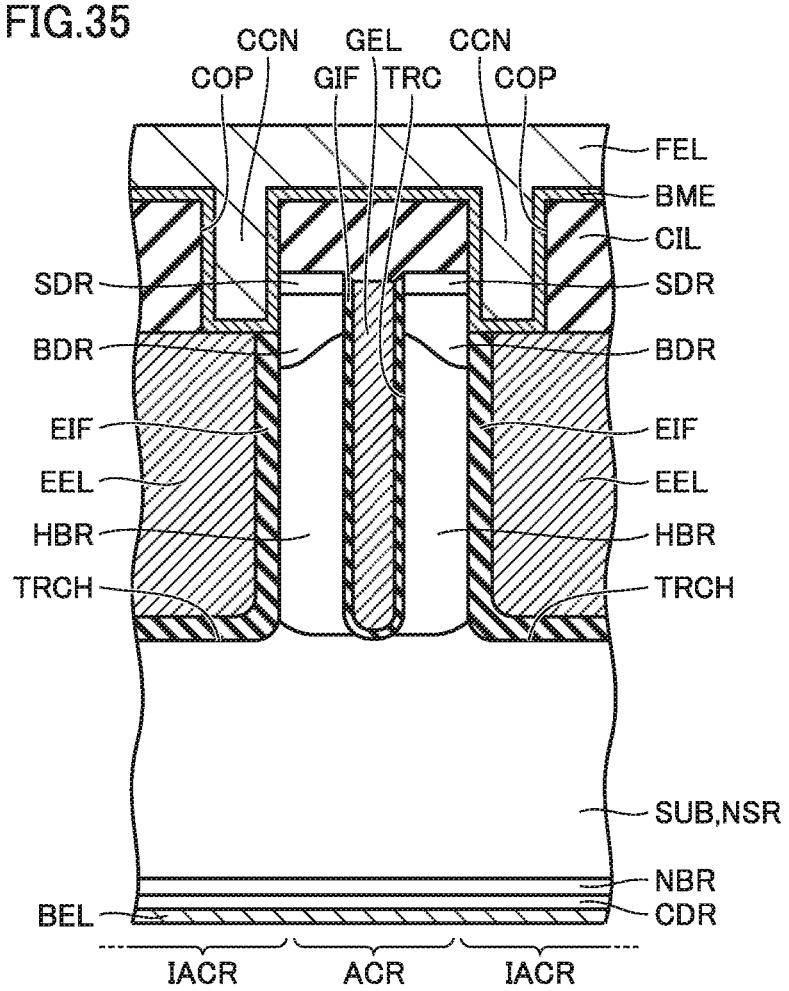

SEMICONDUCTOR DEVICE AND METHOD FOR PRODUCING THE SAME

This nonprovisional application is based on Japanese Patent Application No. 2016-177746 filed on Sep. 12, 2016, with the Japan Patent Office, the entire contents of which are hereby incorporated by reference.

BACKGROUND OF THE INVENTION

Field of the Invention

The present invention relates to a semiconductor device and a method for producing the same, that is for example suitably applicable to a semiconductor device including a trench gate IGBT.

Description of the Background Art

A power semiconductor device includes a trench gate insulated gate bipolar transistor (IGBT) as a switching device. The trench gate IGBT is required to enhance an injection enhancement (IE) effect to make ON-voltage low. As one of patent documents aiming at the IE effect, there is patent document 1 (Japanese Patent Laying-Open No. 2013-140885). This type of trench gate IGBT will hereinafter be referred to as an IE type trench gate IGBT.

The IE type trench gate IGBT has an active region and an inactive region disposed alternately. A trench is formed in the active region and a gate electrode is formed in the trench. In the IE type trench gate IGBT, holes injected from the collector's side are prevented by the inactive region from passing to the emitter's side, and a hole density between the active region and the collector's side is increased. The increased hole density promotes injection of electrons from the emitter's side (the source's side), and accordingly, an increased electron density is also obtained. As a carrier's density is thus increased (i.e., the IE effect), conductivity modulation arises and ON voltage can be made low.

SUMMARY OF THE INVENTION

A semiconductor device including an IE type trench gate IGBT is required to enhance the IE effect to make ON-voltage low, and accordingly, there have been a variety of proposals made.

A semiconductor device according to one embodiment is a semiconductor device comprising a trench gate bipolar transistor, comprising a semiconductor substrate, a first region and a second region, a gate electrode, an emitter electrode, a source region, a base region, a floating region, and a contact portion. The first region and the second region are defined in the semiconductor substrate adjacent to each other. The gate electrode is formed in a first trench extending from the first surface of the semiconductor substrate located in the first region to a first depth, with a first insulating film interposed. The emitter electrode is formed in a second trench extending from the first surface to the first depth, with a second insulating film interposed, such that the emitter electrode is spaced from the gate electrode in such a manner that a region of the semiconductor substrate located in the first region is interposed. The source region is formed from the first surface of the semiconductor substrate located in the first region between the gate electrode and the emitter electrode to a second depth shallower than the first depth. The base region is formed from the second depth of the semiconductor substrate located in the first region between the gate electrode and the emitter electrode to a position deeper than the second depth and shallower than the first depth. The floating region is formed from the first surface of the semiconductor substrate located in the second region to a position deeper than the first depth. The contact portion is electrically connected to the emitter electrode, the source region, and the base region. The contact portion is formed in a manner astride the emitter electrode and the base region. The contact portion has a contact bottom portion inclined in such a manner that a first portion of the contact bottom portion in contact with the emitter electrode is positionally deeper than a second portion of the contact bottom portion in contact with the base region.

A semiconductor device according to another embodiment is a semiconductor device comprising a trench gate bipolar transistor, comprising: a first region and a second region, a gate electrode, a source region, a base region, a carrier passage preventing portion including an emitter electrode, and a contact portion. The first region and the second region are defined in the semiconductor substrate adjacent to each other. The gate electrode is formed in a first trench extending from the first surface of the semiconductor substrate located in the first region to a first depth, with a first insulating film interposed. The source region is formed from the first surface of the semiconductor substrate located between the gate electrode and the second region to a second depth shallower than the first depth. The base region is formed from the second depth of the semiconductor substrate located between the gate electrode and the second region to a position deeper than the second depth. The carrier passage preventing portion including the emitter electrode is formed in a region of the semiconductor substrate located in the second region such that the carrier passage preventing portion is spaced from the gate electrode in such a manner that a region of the semiconductor substrate located in the first region is interposed to prevent a carrier from flowing therethrough. The contact portion is electrically connected to the emitter electrode, the source region, and the base region. The contact portion has a bottom portion in contact with the emitter electrode. The contact portion has a contact side portion in contact with the source region and the base region.

A method for producing a semiconductor device according to still another embodiment is a method for producing a semiconductor device comprising a trench gate bipolar transistor, the method comprising the steps of: defining a first region and a second region adjacent to each other in a semiconductor substrate of a first conductivity type having a first surface; forming a gate electrode in a first trench extending from the first surface of the semiconductor substrate located in the first region to a first depth, with a first insulating film interposed, and also forming an emitter electrode spaced from the first trench in a second trench extending from the first surface of the semiconductor substrate to the first depth, with a second insulating film interposed; introducing an impurity of a second conductivity type into the semiconductor substrate located in the second region to form a floating region; forming a source region of the first conductivity type from the first surface of the semiconductor substrate located in the first region between the gate electrode and the emitter electrode to a second depth; forming a base region of the second conductivity type from the second depth of the semiconductor substrate located in the first region between the gate electrode and the emitter electrode to a position deeper than the second depth and shallower than the first depth; forming a contact interlayer insulating film to cover the first region and the second region; etching the contact interlayer insulating film to form an opening portion exposing the emitter electrode and the source region in a manner astride the emitter electrode and the source region; etching the emitter electrode, the source region, and the base region, by using as an etching mask the contact interlayer insulating film with the opening portion formed therein, to form a contact opening portion; removing a residue in the contact opening portion; and forming in the contact opening portion a contact portion electrically connected to the emitter electrode, the base region, and the source region.

According to a semiconductor device according to one embodiment, the IE effect can be enhanced.

According to a semiconductor device according to another embodiment, the IE effect can be enhanced.

According to a method for producing a semiconductor device according to still another embodiment, a semiconductor device which can enhance the IE effect can be produced.

Other issues and novel features will be apparent from the description in the present specification and the accompanying drawings.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a cross section showing a step in the same embodiment performed after the step shown in FIG. 7.

FIG. 9 is a cross section showing a step in the same embodiment performed after the step shown in FIG. 8.

FIG. 34 is a cross section showing a step in the same embodiment performed after the step shown in FIG. 33.

FIG. 35 is a cross section showing a step in the same embodiment performed after the step shown in FIG. 34.

DESCRIPTION OF THE PREFERRED EMBODIMENTS

Figure 1:
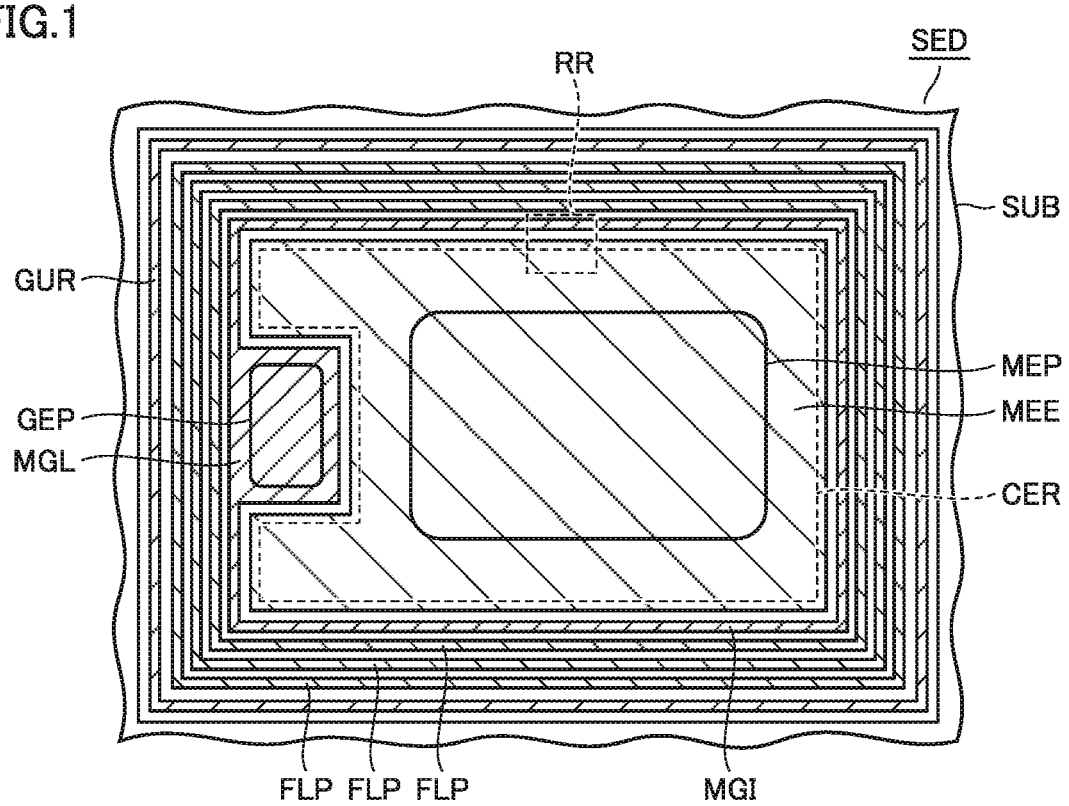
FIG. 1 is a plan view showing a planar structure of a semiconductor device according to each embodiment.

Initially, a general structure of an IE type trench gate IGBT will be described. As shown in FIG. 1, a plurality of looped field plates FLPs are provided such that they are mutually spaced and surround a cell region CER in which the IE type trench gate IGBT is formed. A looped guard ring GUR is formed to surround field plate FLP.

A metal emitter electrode MEE is formed to cover cell region CER. A metal emitter pad MEP is disposed at a center portion of metal emitter electrode MEE. A wire (not shown) will be bonded to metal emitter pad MEP.

a metal gate interconnect MGI is formed between cell region CER and field plate FLP. Metal gate interconnect MGI is electrically connected to a metal gate electrode MGL. A gate pad GEP is disposed at a center portion of metal gate electrode MGL. A wire (not shown) will be bonded to gate pad GEP.

Hereinafter, in each embodiment, a structure of an IE type trench gate IGBT formed in cell region CER will specifically be described. Note that in each embodiment, a peripheral portion of cell region CER and a structure of a region RR shown within a frame of a dotted line in a vicinity thereof shown in FIG. 1 are representatively shown.

First Embodiment

A semiconductor device comprising an IE type trench gate IGBT according to a first embodiment will be described.

Figure 2:
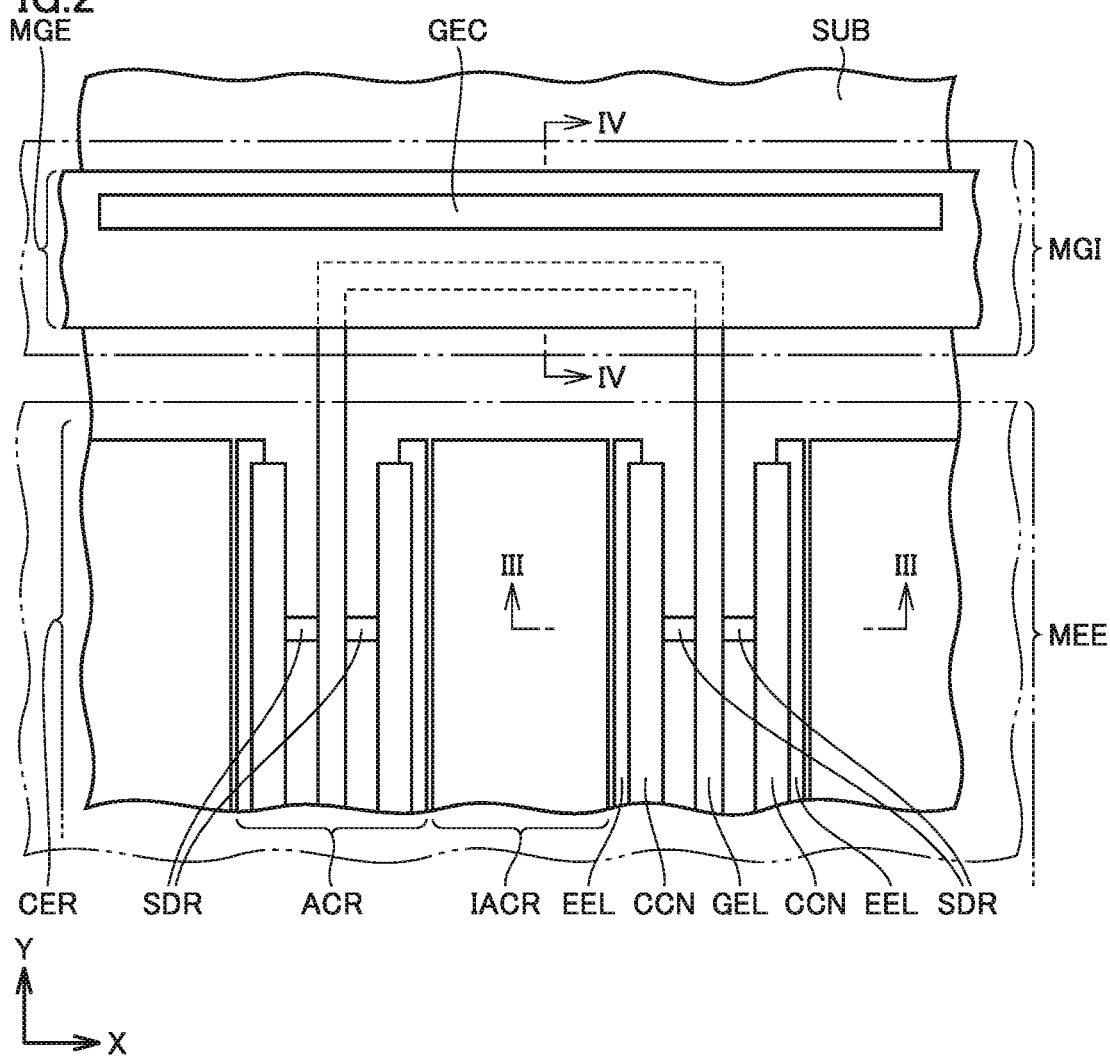
FIG. 2 is a partial plan view of a semiconductor device according to a first embodiment.
Figure 3:
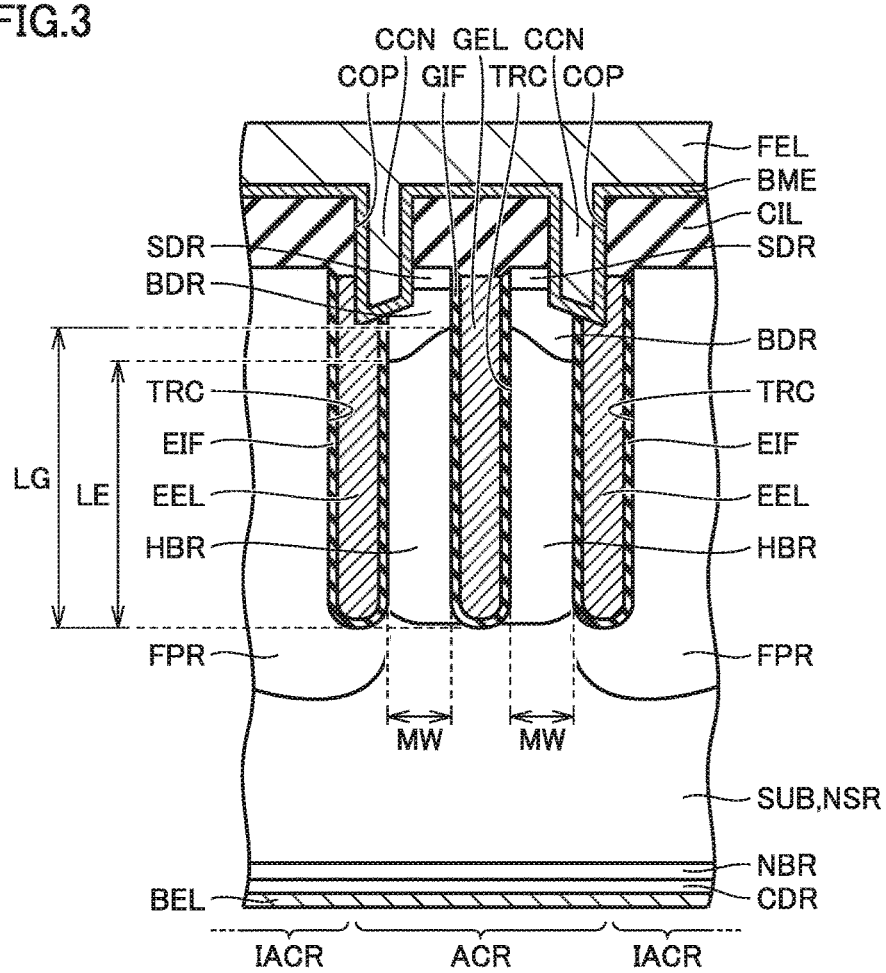
FIG. 3 is a cross section taken along a line III-III shown in FIG. 2 in the same embodiment.

As shown in FIG. 2 and FIG. 3, a semiconductor substrate SUB (a cell region CER) has an active region ACR (a first region) and an inactive region IACR (a second region) defined therein. Active region ACR is located between one inactive region IACR and another inactive region IACR. In active region ACR, a gate electrode GEL is disposed to extend in the y direction. Gate electrode GEL is formed in a trench TRC with a gate insulating film GIF interposed.

An emitter electrode EEL is disposed such that it is spaced from gate electrode GEL by a distance in the x direction with active region ACR (a region of semiconductor substrate SUB) interposed and is thus disposed opposite to gate electrode GEL. Emitter electrode EEL extends in the y direction. Emitter electrode EEL is formed in trench TRC with an emitter insulating film EIF interposed.

In active region ACR (a region of semiconductor substrate SUB) located between gate electrode GEL and emitter electrode EEL, an n+ type source diffusion layer SDR is formed from one surface of semiconductor substrate SUB to a prescribed depth. A p type base diffusion layer BDR is formed from a bottom of source diffusion layer SDR to a further prescribed depth. Base diffusion layer BDR has a base bottom portion inclined in such a manner that a portion of the base bottom portion adjacent to emitter electrode EEL is positionally deeper than a portion of the base bottom portion adjacent to gate electrode GEL.

A length from the portion of the base bottom portion of base diffusion layer BDR adjacent to gate electrode GEL to a lower end of gate electrode GEL is longer than a length from the portion of the base bottom portion of base diffusion layer BDR adjacent to emitter electrode EEL to the lower end of gate electrode GEL. An n type hole barrier layer HBR is formed from a bottom of base diffusion layer BDR to a further prescribed depth. Hole barrier layer HBR is formed to such an extent to reach the lower end portion of gate electrode GEL.

A p type floating diffusion layer FPR is formed in inactive region IACR. Floating diffusion layer FPR is formed from one surface of semiconductor substrate SUB to a position deeper than a lower end portion of emitter electrode EEL.

A contact interlayer insulating film CIL is formed to cover gate electrode GEL, source diffusion layer SDR, emitter electrode EEL, etc. A contact portion CCN is formed to penetrate contact interlayer insulating film CIL and thus contact emitter electrode EEL, base diffusion layer BDR, and source diffusion layer SDR.

Contact portion CCN is formed as a common contact portion in a manner astride emitter electrode EEL and base diffusion layer BDR. Contact portion CCN has a contact bottom portion inclined in such a manner that a portion of the contact bottom portion in contact with emitter electrode EEL is positionally deeper than a portion of the contact bottom portion in contact with base diffusion layer BDR. A metal emitter electrode MEE is formed in contact with contact portion CCN. Metal emitter electrode MEE is formed of aluminum film for example.

A p type collector diffusion layer CDR is formed from the other surface of semiconductor substrate SUB to a prescribed depth. An N type buffer layer NBR is formed from a bottom of collector diffusion layer CDR to a further prescribed depth. A back electrode BEL (a collector electrode) is formed in contact with collector diffusion layer CDR.

Figure 4:
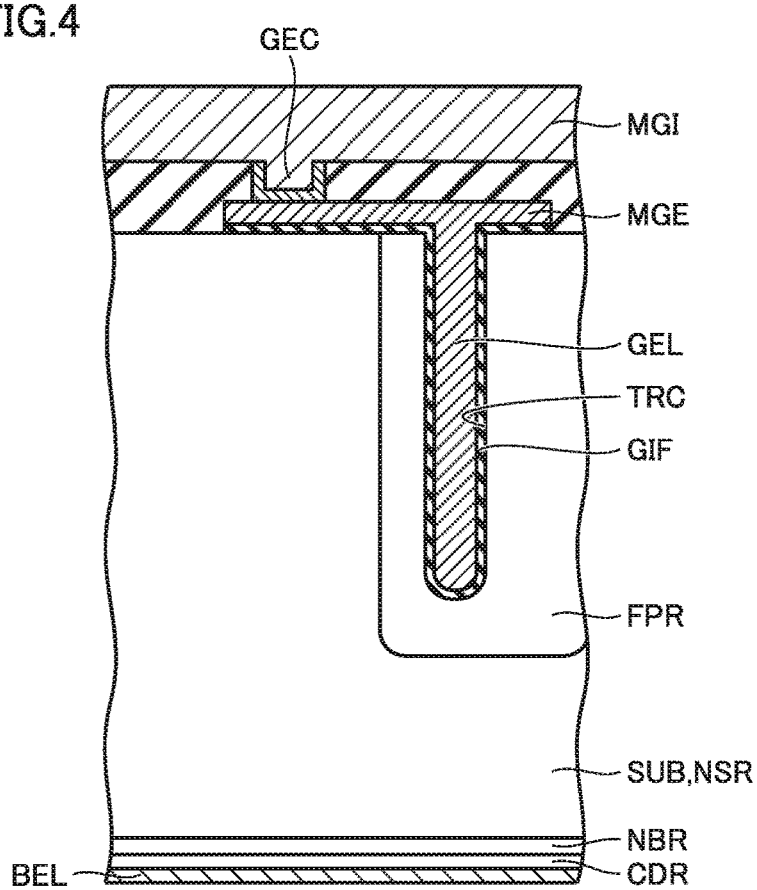
FIG. 4 is a cross section taken along a line IV-IV shown in FIG. 2 in the same embodiment.

Hereinafter, a structure connecting gate electrode GEL and metal gate interconnect MGI will be described. As shown in FIG. 2 and FIG. 4, gate electrode GEL extends to directly under a region where metal gate interconnect MGI is disposed. Immediately adjacent gate electrodes GELs have end portions, respectively, connected via a portion of gate electrode GEL extending in the x direction.

A gate interconnect extracting portion MGE is formed directly under metal gate interconnect MGI. Gate interconnect extracting portion MGE is formed in contact with a portion of gate electrode GEL extending in the x direction. Gate interconnect extracting portion MGE is electrically connected to metal gate interconnect MGI via a gate contact portion GEC.

Thus, the semiconductor device comprising the IE type trench gate IGBT has emitter electrode EEL and base and source diffusion layers BDR and SDR electrically connected by common contact portion CCN in contact with emitter electrode EEL, base diffusion layer BDR, and source diffusion layer SDR. Contact portion CCN has a contact bottom portion inclined in such a manner that a portion of the contact bottom portion in contact with emitter electrode EEL is positionally deeper than a portion of the contact bottom portion in contact with base diffusion layer BDR.

Furthermore, base diffusion layer BDR has a base bottom portion inclined in such a manner that a portion of the base bottom portion adjacent to emitter electrode EEL is positionally deeper than a portion of the base bottom portion adjacent to gate electrode GEL. A length from the portion of the base bottom portion of base diffusion layer BDR adjacent to gate electrode GEL to a lower end of gate electrode GEL is longer than a length from the portion of the base bottom portion of base diffusion layer BDR adjacent to emitter electrode EEL to the lower end of gate electrode GEL.

In the above described semiconductor device, in turning on the IE type trench gate IGBT, when a voltage equal to or greater than a threshold voltage is applied to gate electrode GEL to inject electrons from source diffusion layer SDR through a channel to an N type region NSR of semiconductor substrate SUB, a PN junction of N type region NSR and collector diffusion layer CDR is forward-biased and holes are injected from collector diffusion layer CDR to N type region NSR. The injected holes are prevented by inactive region IACR from passing to the side of source diffusion layer SDR (or the emitter), and the holes are accumulated in N type region NSR of semiconductor substrate SUB and floating diffusion layer FPR, and an increased hole density is obtained.

The increased hole density in N type region NSR etc. promotes injection of electrons from source diffusion layer SDR (or the emitter), and accordingly, an increased electron density is also obtained. As a carrier's density in N type region NSR etc. is thus increased, conductivity modulation arises and ON voltage can be made low.

Hereinafter, an example of a method for producing a semiconductor device comprising the IE type trench gate IGBT as described above will be described.

Figure 5:
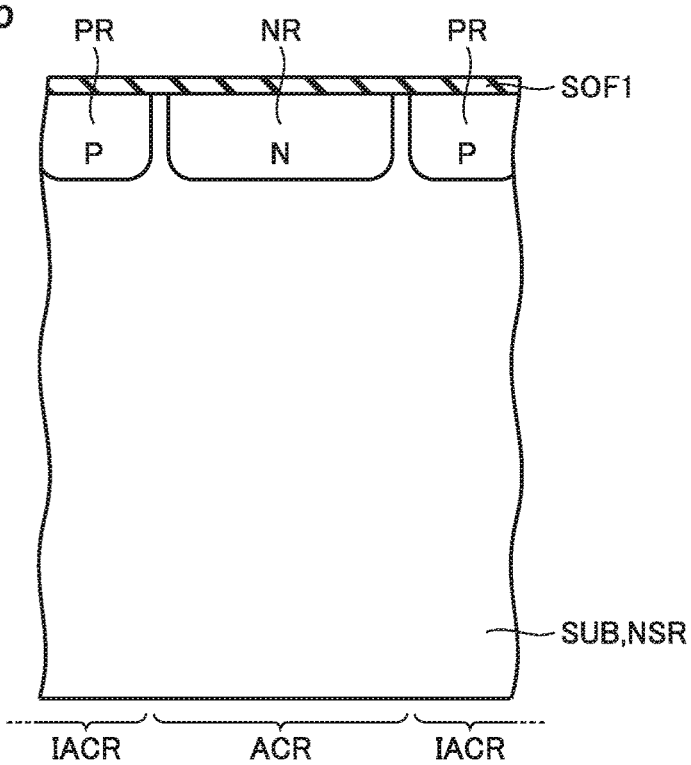
FIG. 5 is a cross section showing a step of a method for producing a semiconductor device in the same embodiment.

As shown in FIG. 5, a silicon oxide film SOF1 is initially formed to cover one surface of a semiconductor substrate. Subsequently, with silicon oxide film SOF1 formed, a p type impurity is implanted in inactive region IACR to form a P type region PR to serve as a floating diffusion layer. Subsequently, an n type impurity is implanted in active region ACR to form an N type region NR to serve as a hole barrier layer.

Figure 6:
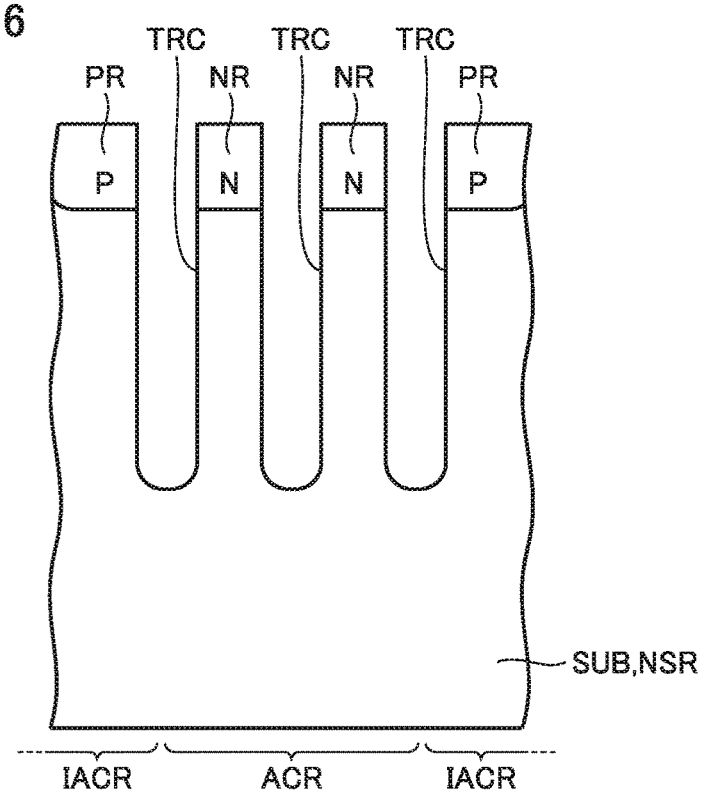
FIG. 6 is a cross section showing a step in the same embodiment performed after the step shown in FIG. 5.

Subsequently, a hard mask (not shown) formed for example of silicon oxide film etc. for forming a trench is formed. Subsequently, by using the hard mask as an etching mask, semiconductor substrate SUB is etched to form a trench TRC (see FIG. 6). Subsequently, the hard mask is removed, and as shown in FIG. 6, a surface of semiconductor substrate SUB with trench TRC formed is exposed.

Trench TRC has a depth for example of about 3 μm to about 5 μm. Trench TRC has a width for example of about 0.4 μm to about 0.5 μm. Immediately adjacent trenches TRCs are spaced for example by about 0.8 μm to 0.9 μm. Note that these numerical values are only an example.

Figure 7:
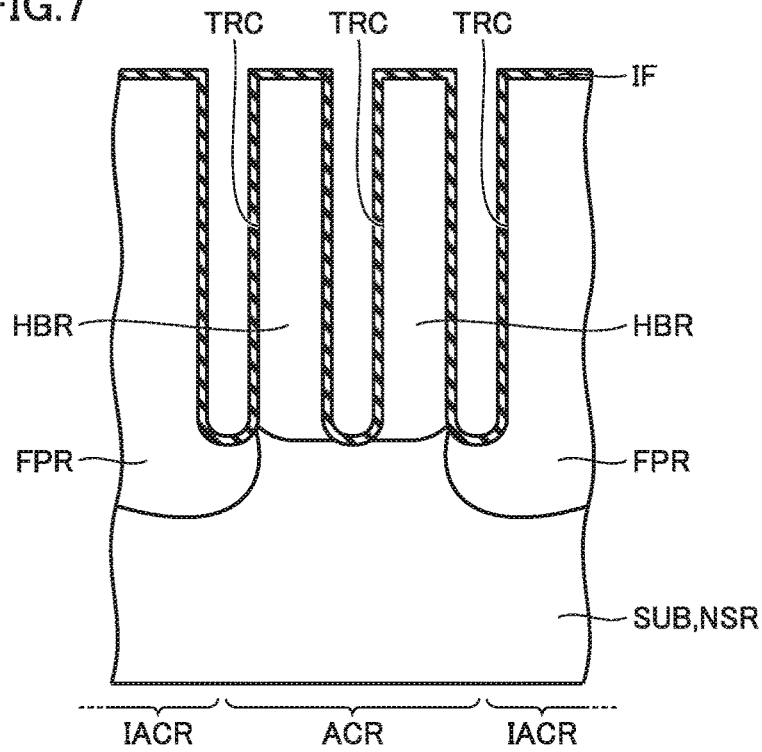
FIG. 7 is a cross section showing a step in the same embodiment performed after the step shown in FIG. 6.

Subsequently, a prescribed heat treatment is performed to diffuse the p type impurity of P type region PR to form floating diffusion layer FPR. Furthermore, n type impurity of N type region NR is diffused to form hole barrier layer HBR. Subsequently, as shown in FIG. 7, for example a thermal oxidation process is performed to form an insulating film IF to serve as a gate insulating film etc. on a surface of semiconductor substrate SUB including an internal wall surface of trench TRC. Subsequently, as shown in FIG. 8, for example in a manner in which chemical vapor deposition (CVD) is employed to fill trench TRC, a polysilicon film PSF is formed to cover semiconductor substrate SUB.

Subsequently, polysilicon film PSF has a surface entirely etched to remove a portion of polysilicon film PSF located on an upper surface of semiconductor substrate SUB. Furthermore, polysilicon film PSF is over-etched. Thus, as shown in FIG. 9, an upper surface of polysilicon film PSF remaining in trench TRC is lower in level than a surface of semiconductor substrate SUB.

Figure 10:
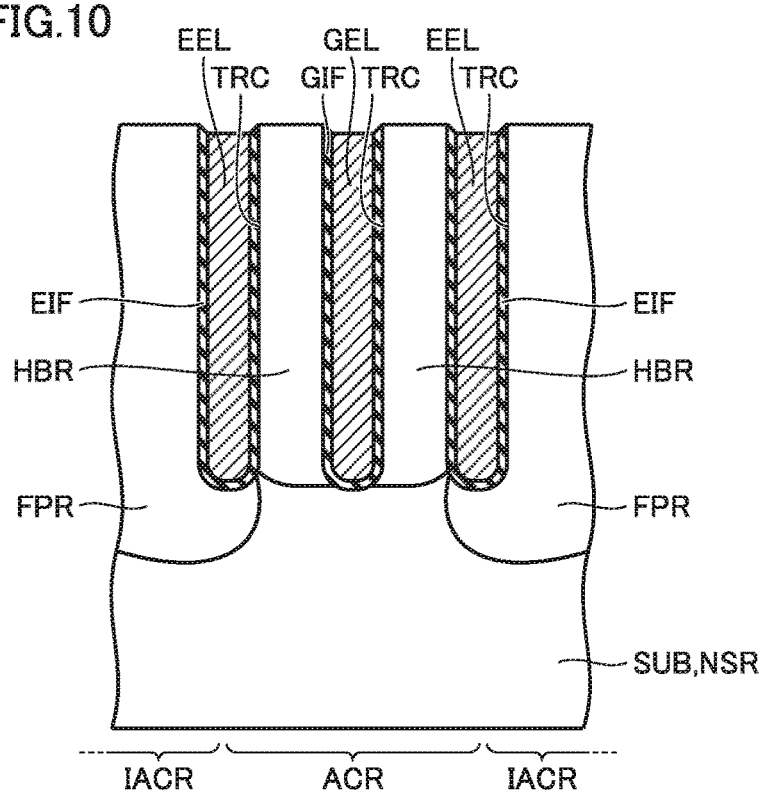
FIG. 10 is a cross section showing a step in the same embodiment performed after the step shown in FIG. 9.

Subsequently, as shown in FIG. 10, insulating film IF exposed on the upper surface of semiconductor substrate SUB is removed. Thus, gate electrode GEL is formed in trench TRC with gate insulating film GIF interposed and emitter electrode EEL is formed in trench TRC with emitter insulating film EIF interposed.

Figure 11:
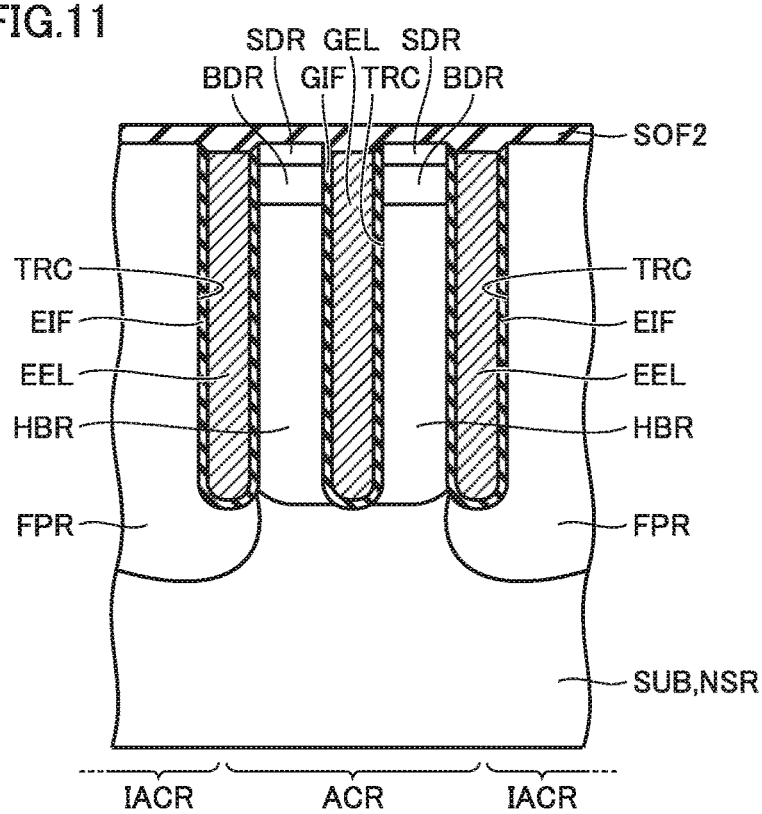
FIG. 11 is a cross section showing a step in the same embodiment performed after the step shown in FIG. 10.

Subsequently, as shown in FIG. 11, a silicon oxide film SOF2 is formed to cover semiconductor substrate SUB. Subsequently, a photomechanical process is performed to form a photoresist pattern (not shown) for forming a source diffusion layer and a base diffusion layer. Subsequently, a p type impurity is implanted with the photoresist pattern used as an implanting mask. Furthermore, an n type impurity is implanted with the photoresist pattern used as an implanting mask. Subsequently, the photoresist pattern is removed.

Thus, as shown in FIG. 11, source diffusion layer SDR is formed from a surface of semiconductor substrate SUB located in active region ACR to a prescribed depth. Base diffusion layer BDR is formed from a bottom of source diffusion layer SDR to a further deeper position. At this point in time, base diffusion layer BDR has a bottom portion at a substantially uniform depth.

Figure 12:
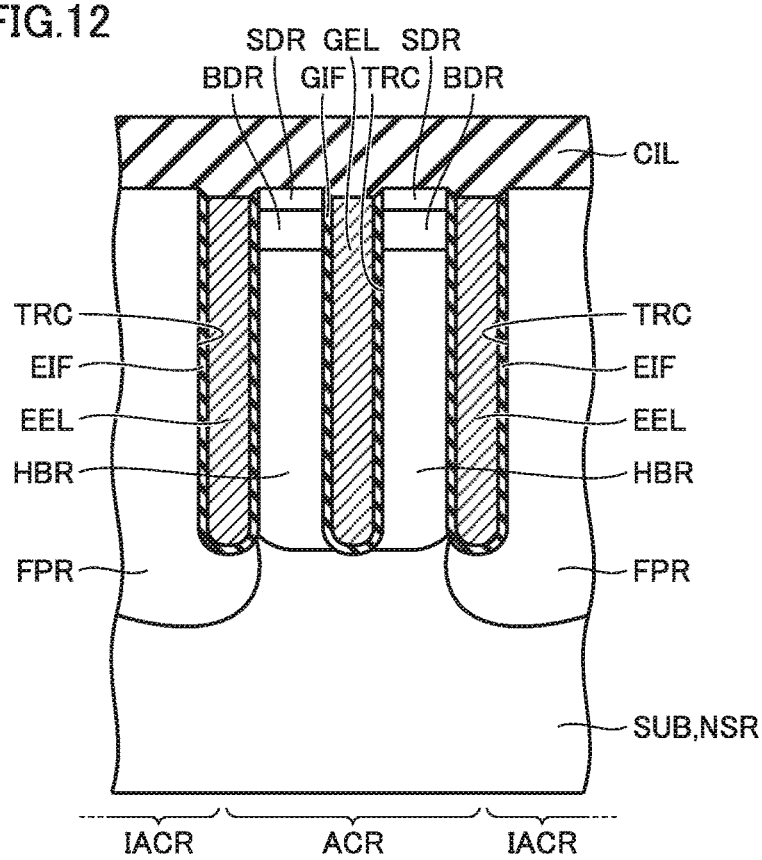
FIG. 12 is a cross section showing a step in the same embodiment performed after the step shown in FIG. 11.

Subsequently, as shown in FIG. 12, contact interlayer insulating film CIL is formed to cover semiconductor substrate SUB. Subsequently, a prescribed photomechanical process is performed to form a photoresist pattern (not shown) for forming a contact portion (a contact opening portion). Subsequently, by using the photoresist pattern as an etching mask, contact interlayer insulating film CIL is etched to form an opening portion HOP (see FIG. 13).

At the time, gate insulating film GIF is overetched, and a recess is thus formed. Since it is necessary to finally form a contact opening portion without a local step, etching contact interlayer insulating film CIL requires setting a condition considering an amount of etching in a subsequent etching step. Subsequently, the photoresist pattern is removed.

Figure 13:
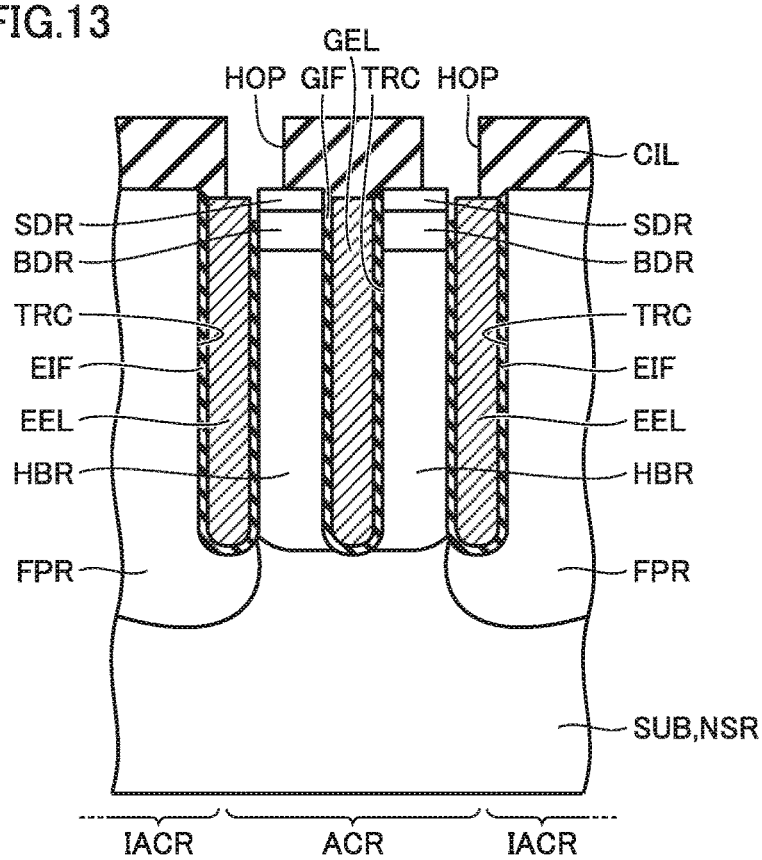
FIG. 13 is a cross section showing a step in the same embodiment performed after the step shown in FIG. 12.

Thus, as shown in FIG. 13, contact interlayer insulating film CIL in which opening portion HOP is formed is formed as a hard mask. Opening portion HOP is formed astride source diffusion layer SDR and emitter electrode EEL.

Figure 14:
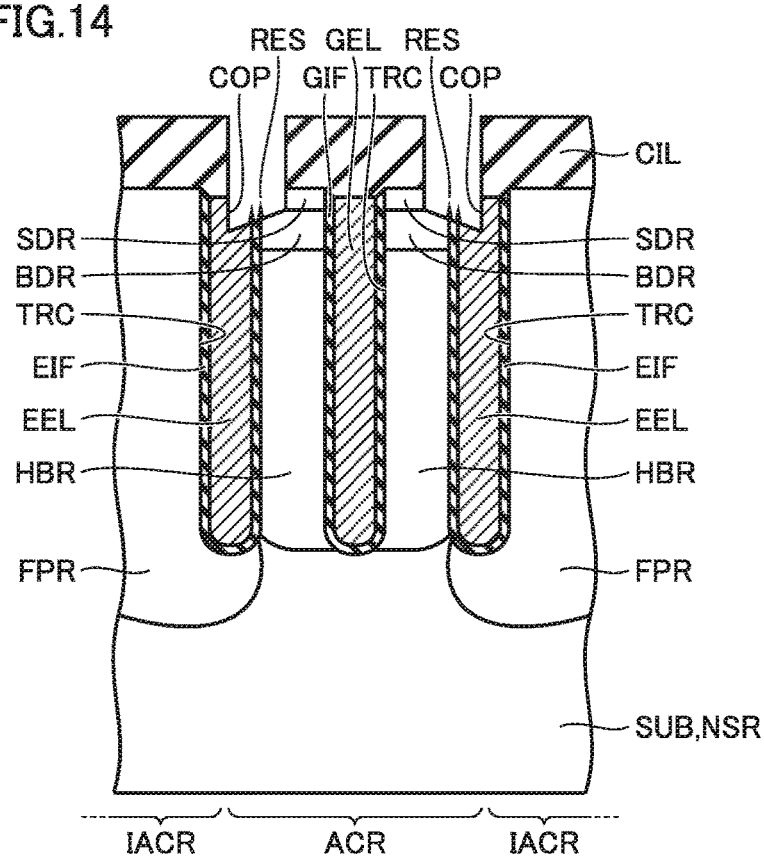
FIG. 14 is a cross section showing a step in the same embodiment performed after the step shown in FIG. 13.

Subsequently, as shown in FIG. 14, using contact interlayer insulating film CIL serving as the hard mask as an etching mask, source diffusion layer SDR (semiconductor substrate SUB), emitter electrode EEL (polysilicon film PSF), etc. which are exposed are etched to form a contact opening portion COP.

In doing so, emitter electrode EEL (polysilicon film PSF) is etched faster than source diffusion layer SDR (semiconductor substrate SUB). Accordingly, contact opening portion COP is deeper at a side thereof adjacent to emitter electrode EEL than at a side thereof adjacent to base diffusion layer BDR.

Furthermore, in addition to emitter electrode EEL and base diffusion layer BDR being etched at different rates, as emitter insulating film EIF is interposed between semiconductor substrate SUB and emitter electrode EEL (polysilicon film PSF), a portion of emitter insulating film EIF and a portion of silicon (semiconductor substrate SUB) etc. remain as a residue RES.

Figure 15:
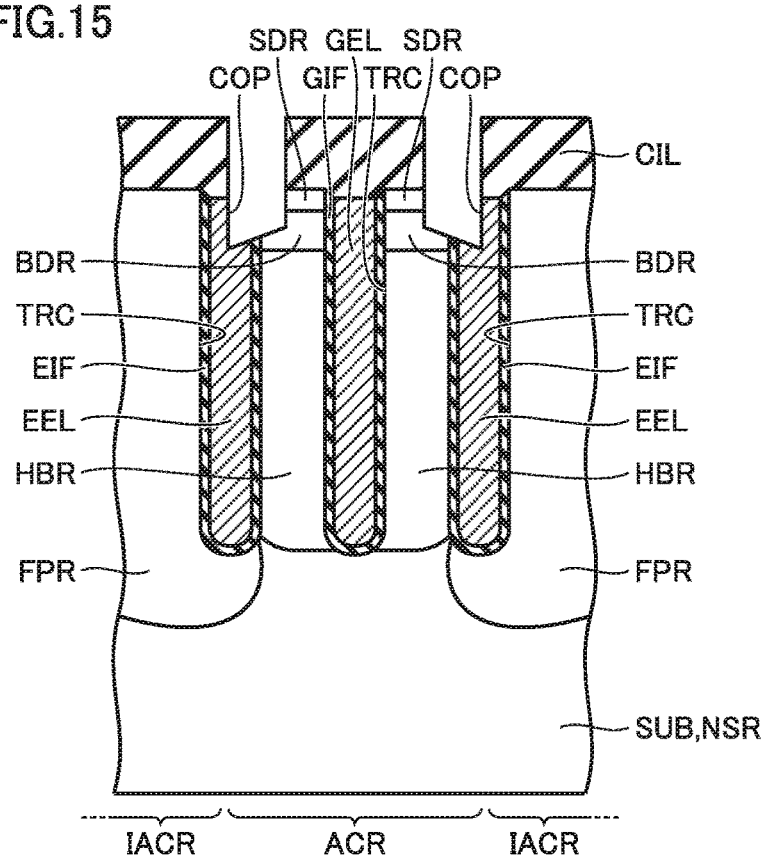
FIG. 15 is a cross section showing a step in the same embodiment performed after the step shown in FIG. 14.

Subsequently, as shown in FIG. 15, residue RES is removed by performing a dry etching step. Furthermore, emitter electrode EEL and base diffusion layer BDR are etched to form contact opening portion COP of a prescribed depth. Contact opening portion COP has an opening bottom surface inclined in a manner in which a portion of the opening bottom surface adjacent to emitter electrode EEL is deeper than a portion of the opening bottom surface adjacent to base diffusion layer BDR.

Figure 16:
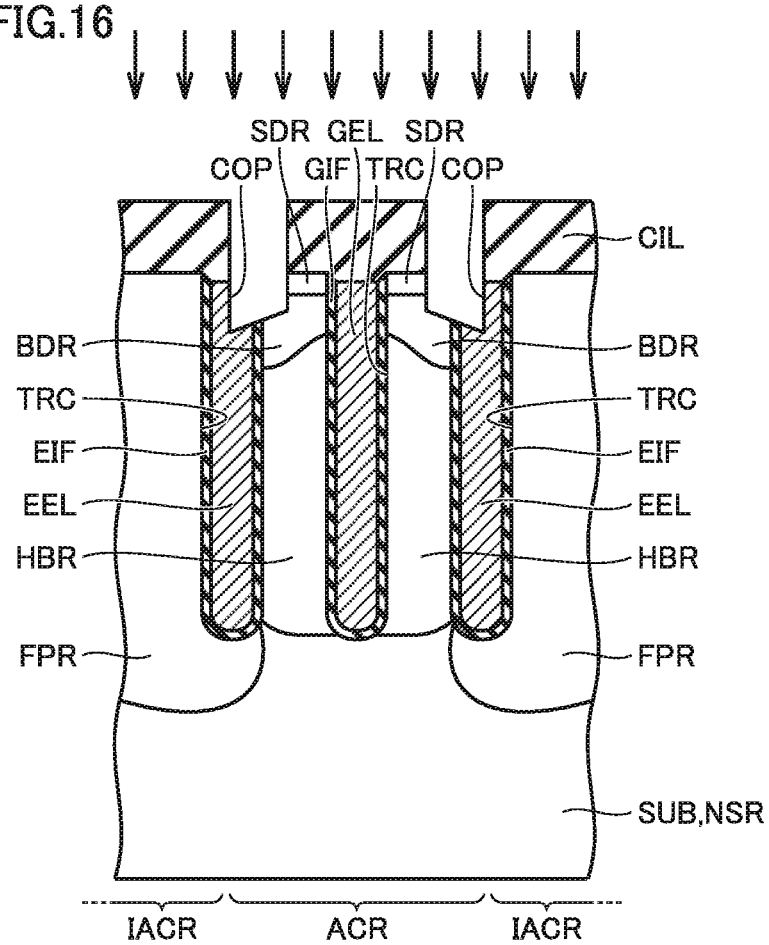
FIG. 16 is a cross section showing a step in the same embodiment performed after the step shown in FIG. 15.

Subsequently, as shown in FIG. 16, a p type impurity is implanted in base diffusion layer BDR by using as an implanting mask contact interlayer insulating film CIL in which contact opening portion COP is formed. In doing so, the p type impurity is implanted from contact opening portion COP, and accordingly, in base diffusion layer BDR, a portion thereof adjacent to emitter electrode EEL is formed to a position deeper than a portion thereof adjacent to gate electrode GEL. Base diffusion layer BDR will thus have a base bottom portion inclined in such a manner that a portion of the base bottom portion adjacent to emitter electrode EEL is positionally deeper than a portion of the base bottom portion adjacent to gate electrode GEL.

Figure 17:
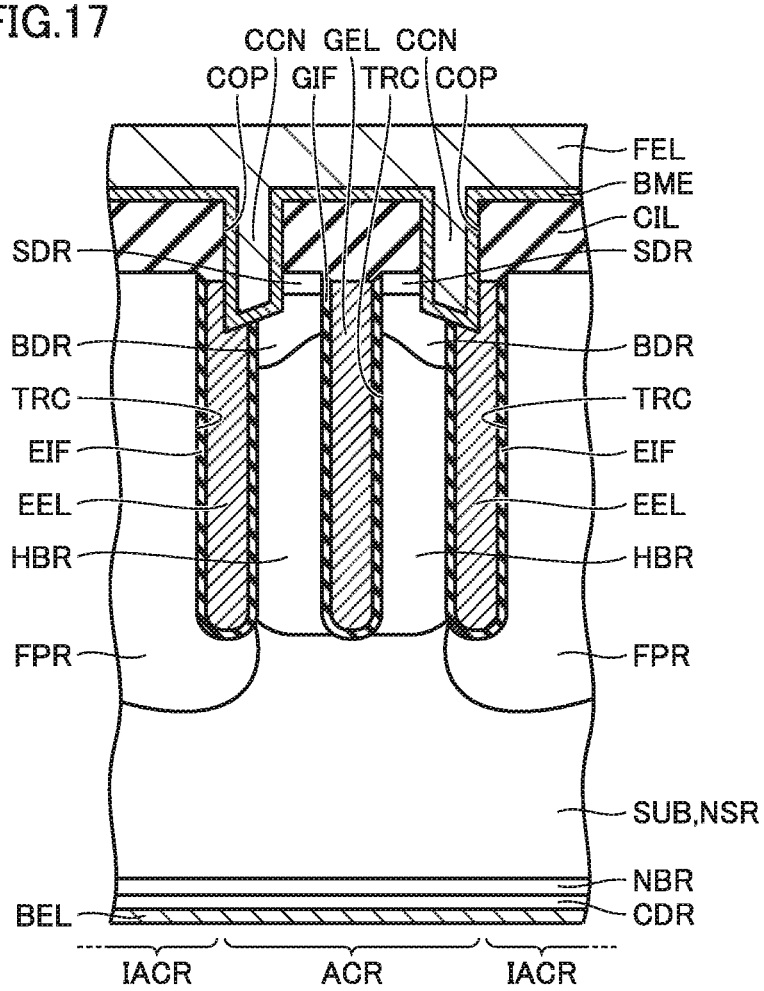
FIG. 17 is a cross section showing a step in the same embodiment performed after the step shown in FIG. 16.

Subsequently, as shown in FIG. 17, a barrier metal film BME, such as a titanium tungsten film, is formed on contact interlayer insulating film CIL to cover an internal wall surface of contact opening portion COP. Subsequently, for example, an aluminum film is formed to cover barrier metal film BME in a manner filling contact opening portion COP. Contact portion CCN is formed by a portion of barrier metal film BME and a portion of the aluminum film that fill contact opening portion COP. Furthermore, metal emitter electrode MEE electrically connected to contact portion CCN is formed.

In contrast, an n type impurity is implanted into the other surface of semiconductor substrate SUB to form an N type buffer layer NBR. Subsequently, a p type impurity is implanted into the other surface of semiconductor substrate SUB to form p type collector diffusion layer CDR. Subsequently, back electrode BEL in contact with collector diffusion layer CDR is formed and a major portion of the semiconductor device shown in FIGS. 2 and 3 is completed.

The semiconductor device comprising the IE type trench gate IGBT as described above can further enhance the IE effect. This will be described in comparison with a semiconductor device comprising an IE type trench gate IGBT according to a comparative example.

Figure 18:
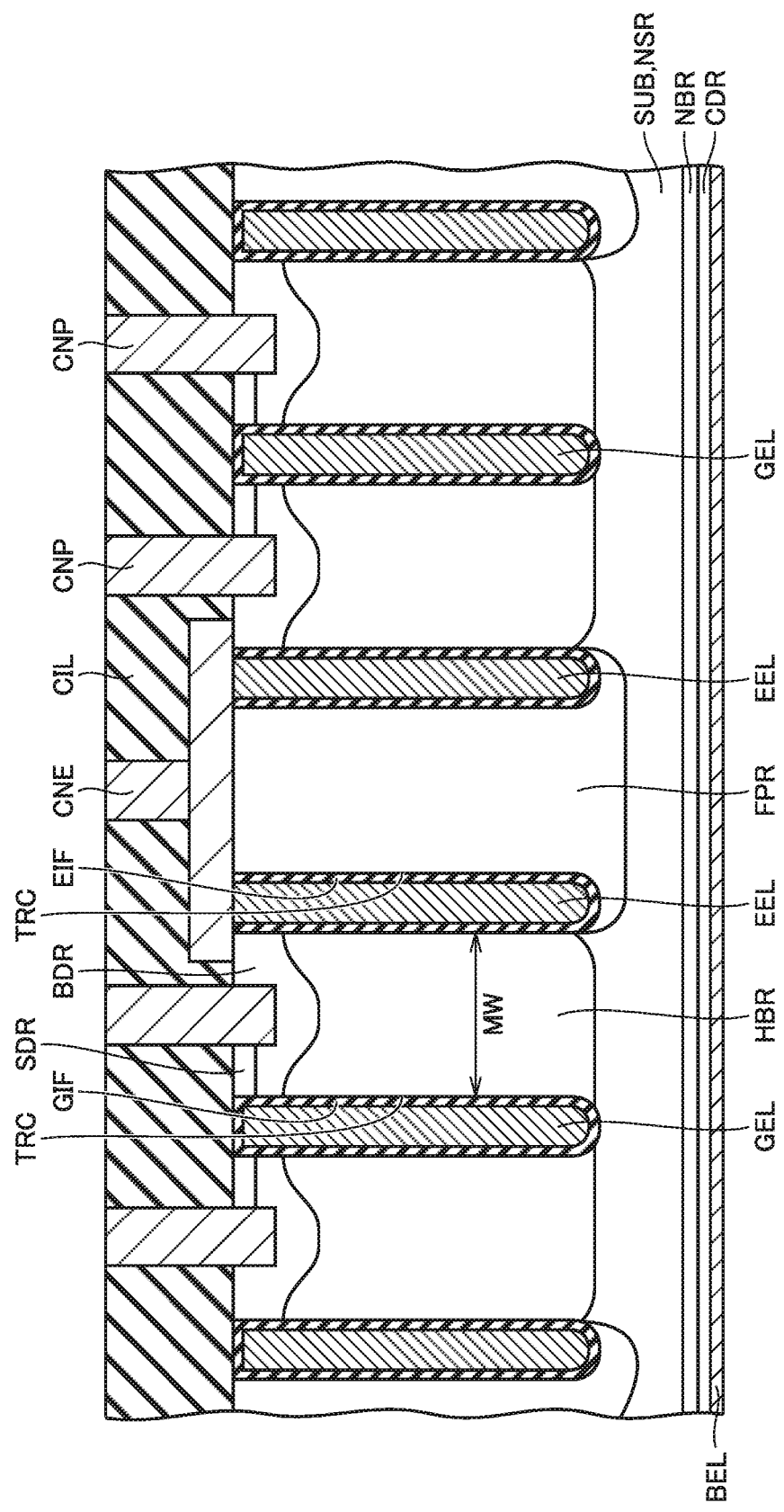
FIG. 18 is a partial cross section of a semiconductor device according to a comparative example.

As shown in FIG. 18, the semiconductor device according to the comparative example is formed such that a contact portion CNE electrically connected to emitter electrode EEL and a contact portion CNP electrically connected to source diffusion layer SDR and base diffusion layer BDR are individually formed. Note that for a remainder in configuration, any member identical to that of the semiconductor device according to the first embodiment is identically denoted and will not be described redundantly unless necessary.

Generally, in order to increase the IE effect in a semiconductor device comprising an IE type trench gate IGBT, the following three points are effective: reducing a spacing between the gate electrode and the emitter electrode (a mesa width) (a method A); increasing a distance from the base diffusion layer to a lower end of the trench (a lower end of the gate electrode) (a method B); and increasing the inactive region (a method C). Herein, enhancement of the IE effect is sought mainly from the viewpoint of method A.

In the semiconductor device according to the comparative example, when an attempt is made to narrow a mesa width MW, contact portion CNP would approach gate electrode GEL, and there is a possibility that contact portion CNP and gate electrode GEL may electrically short-circuit. Accordingly, there is a limit in narrowing mesa width MW.

In contrast to the semiconductor device according to the comparative example, the semiconductor device according to the first embodiment has common contact portion CCN formed as a contact portion electrically connected to emitter electrode EEL and a contact portion electrically connected to source diffusion layer SDR and base diffusion layer BDR. Contact portion CCN is formed astride source and base diffusion layers SDR and BDR and emitter electrode EEL. Thus, the semiconductor device according to the first embodiment allows mesa width MW (see FIG. 3) to be further narrowed than the semiconductor device according to the comparative example. As a result, it can further enhance the IE effect and reduce ON voltage.

Furthermore, in the semiconductor device according to the embodiment, contact opening portion COP is formed such that emitter electrode EEL and base diffusion layer BDR are exposed at a bottom surface of contact opening portion COP and base diffusion layer BDR and source diffusion layer SDR are exposed at a side surface of contact opening portion COP. A p type impurity is implanted in base diffusion layer BDR from contact opening portion COP, and accordingly, in base diffusion layer BDR, a portion thereof adjacent to emitter electrode EEL will be formed to a position deeper than a portion thereof adjacent to gate electrode GEL.

This allows base diffusion layer BDR to have a side thereof adjacent to gate electrode GEL formed to be shallow in accordance with the inclination of the bottom portion of contact opening portion COP, and can make larger a length LG from a portion of a bottom portion of base diffusion layer BDR adjacent to gate electrode GEL to a lower end of gate electrode GEL (see FIG. 3, method B). As a result, the IE effect can further be enhanced.

Furthermore, when turning off the IE type trench gate IGBT, a carrier (i.e., holes) accumulated in N type region NSR will flow through base diffusion layer BDR at a portion adjacent to emitter electrode EEL and formed to reach a deeper position, and an operation of a parasitic transistor can be suppressed that is attributed to holes flowing through base diffusion layer BDR at a portion adjacent to gate electrode GEL.

Second Embodiment

As a semiconductor device comprising an IE type trench gate IGBT according to a second embodiment, a semiconductor device which can further narrow the mesa width will be described.

Figure 19:
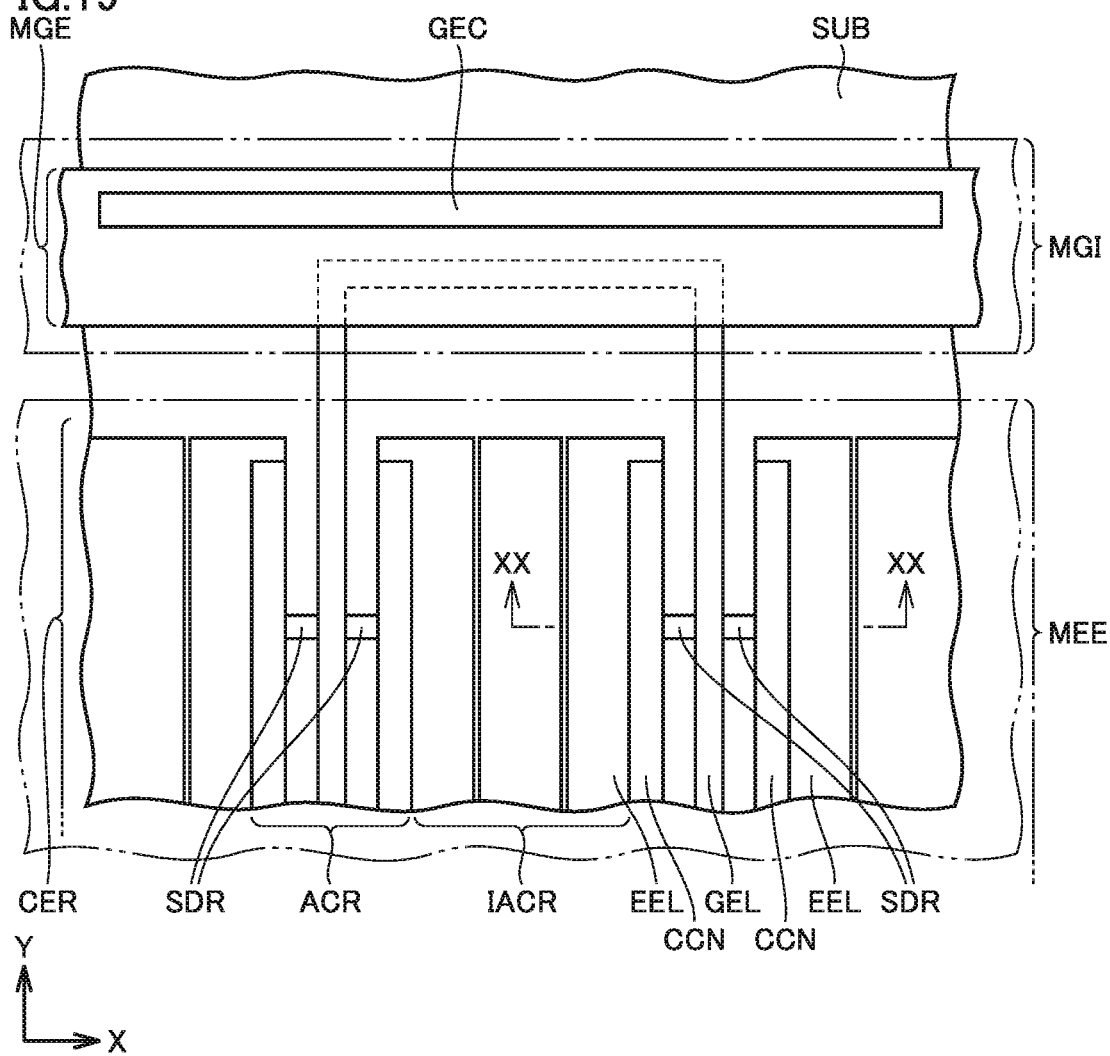
FIG. 19 is a partial plan view of a semiconductor device according to a second embodiment.
Figure 20:
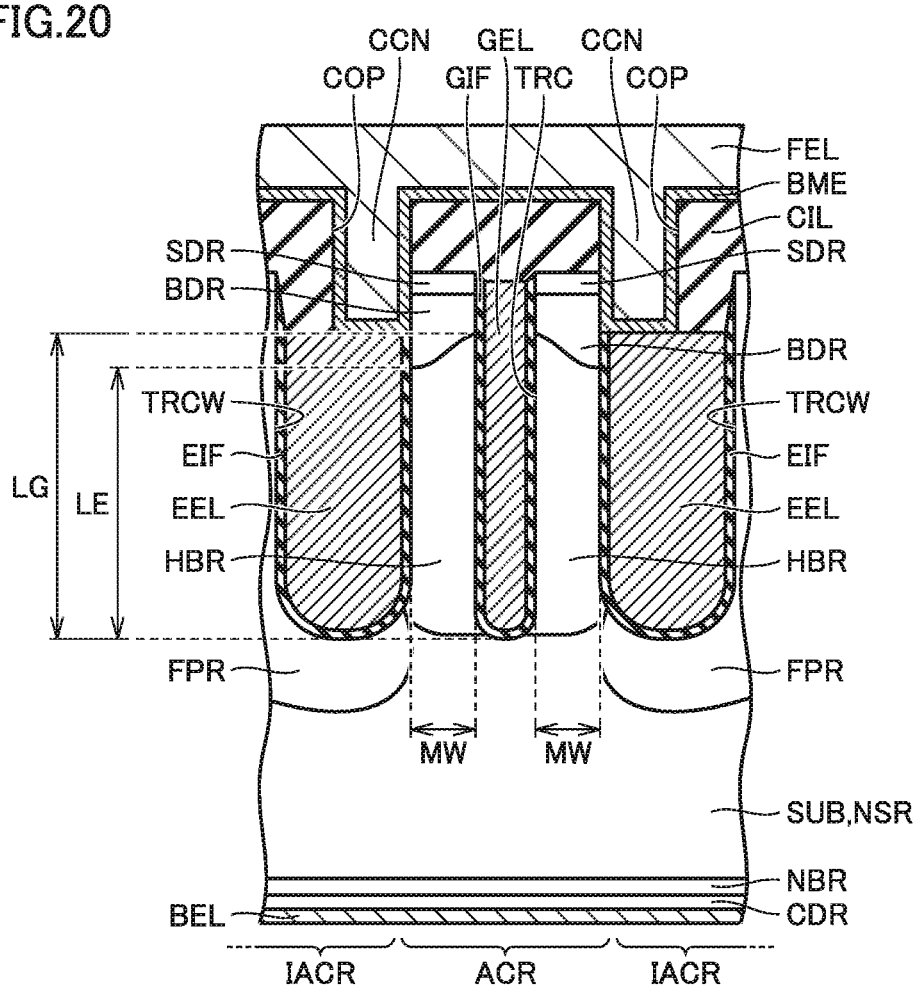
FIG. 20 is a cross section taken along a cross sectional line XX-XX shown in FIG. 19 in the same embodiment.

As shown in FIG. 19 and FIG. 20, in active region ACR, gate electrode GEL is disposed to extend in the y direction. Gate electrode GEL is formed in trench TRC with gate insulating film GIF interposed.

Emitter electrode EEL is disposed such that it is spaced from gate electrode GEL by a distance in the x direction with active region ACR (a region of semiconductor substrate SUB) interposed and is thus disposed opposite to gate electrode GEL. Emitter electrode EEL extends in the y direction. Emitter electrode EEL is formed in trench TRC with emitter insulating film EIF interposed. A width EW of emitter electrode EEL is larger than a width GW of gate electrode GEL.

Common contact portion CCN has a contact bottom portion in contact with emitter electrode EEL. Furthermore, common contact portion CCN has a contact side portion in contact with source diffusion layer SDR and base diffusion layer BDR. An upper surface of emitter electrode EEL is lower in level than an upper surface of gate electrode GEL. Note that a remainder in configuration is similar to a configuration of the semiconductor device shown in FIGS. 1-3, and accordingly, any identical member is identically denoted and will not be described redundantly unless necessary.

Figure 21:
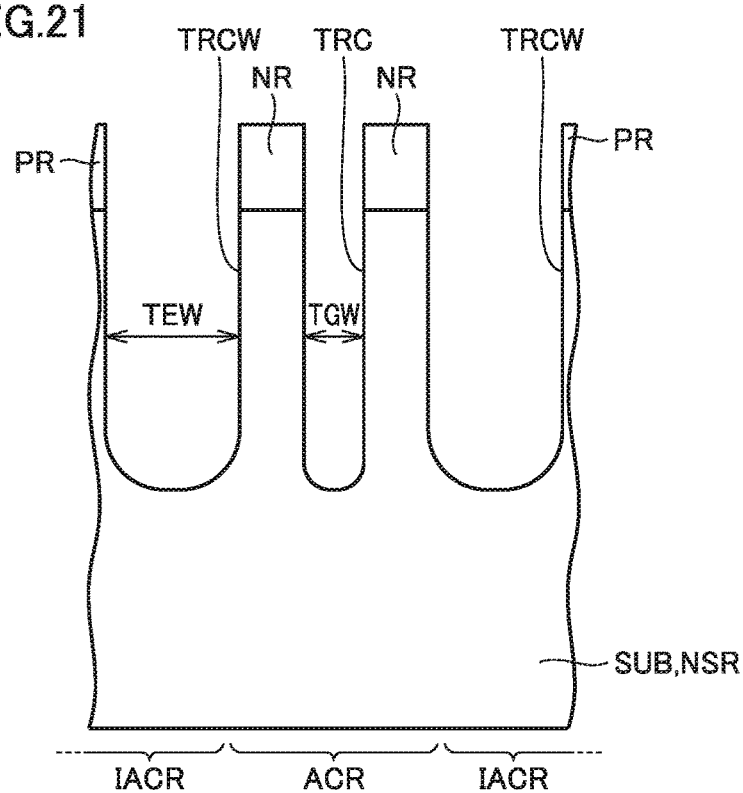
FIG. 21 is a cross section showing a step of a method for producing a semiconductor device in the same embodiment.

Hereinafter, an example of a method for producing the semiconductor device described above will be described. After steps similar to those shown in FIG. 5 and FIG. 6 are performed, then, as shown in FIG. 21, trench TRC and a trench TRCW of a prescribed depth are formed in semiconductor substrate SUB. A width TEW of trench TRCW in which the emitter electrode will be formed is larger than a width TGW of trench TRC in which the gate electrode will be formed.

Figure 22:
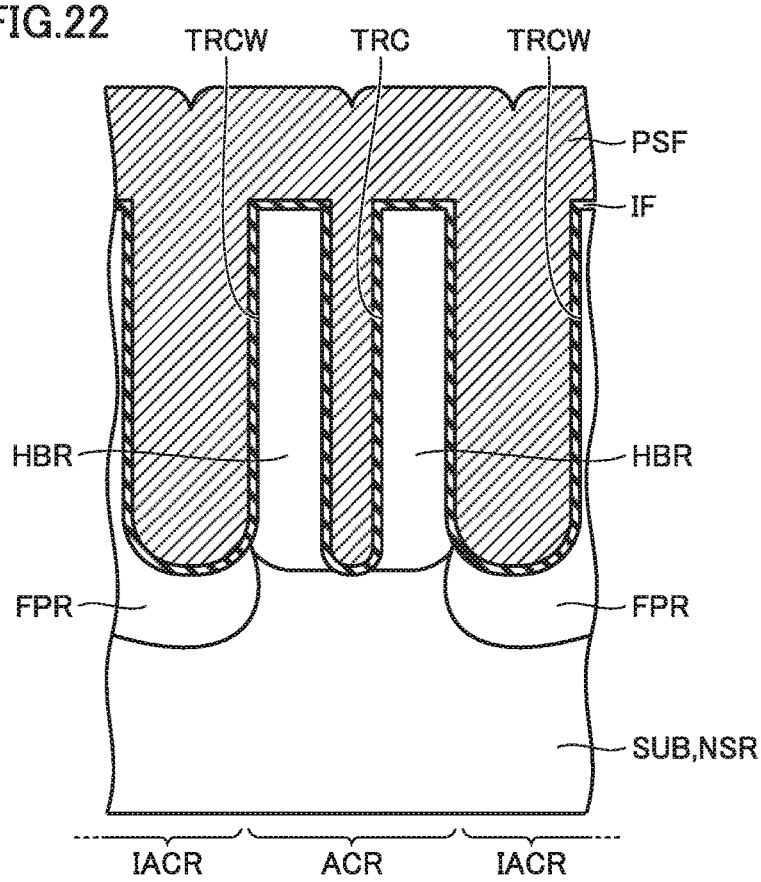
FIG. 22 is a cross section showing a step in the same embodiment performed after the step shown in FIG. 21.
Figure 23:
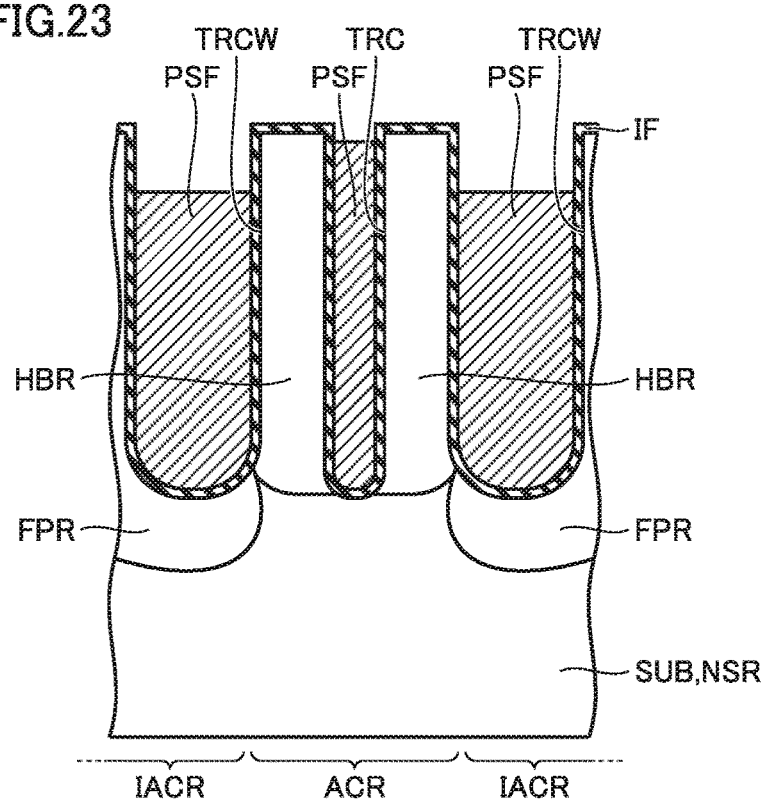
FIG. 23 is a cross section showing a step in the same embodiment performed after the step shown in FIG. 22.
Figure 24:
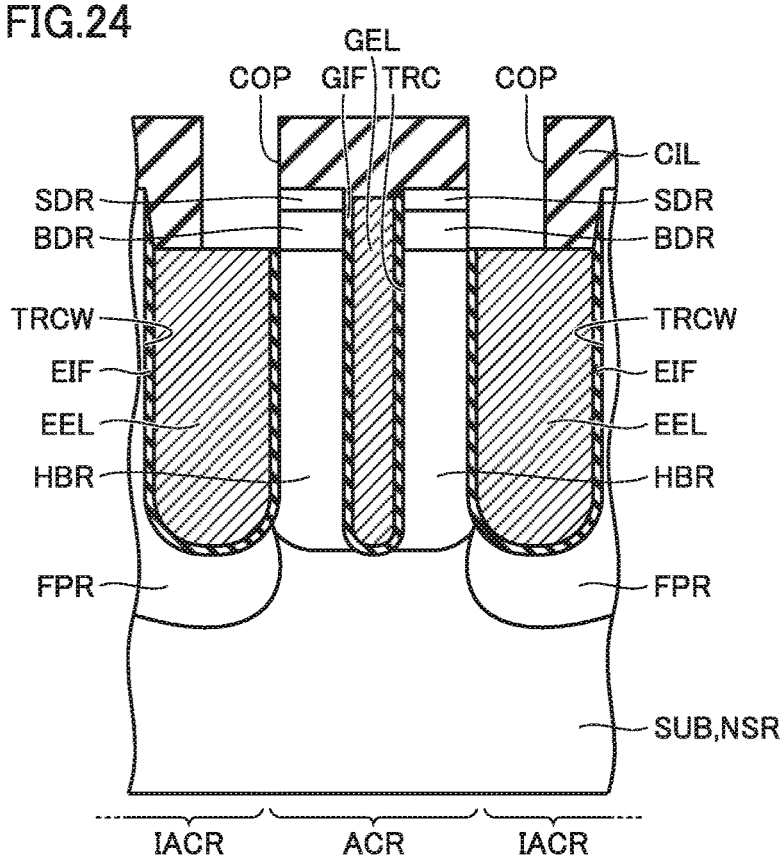
FIG. 24 is a cross section showing a step in the same embodiment performed after the step shown in FIG. 23.

Subsequently, as shown in FIG. 22, in a manner filling trench TRC and trench TRCW, polysilicon film PSF is formed to cover semiconductor substrate SUB. Subsequently, polysilicon film PSF has a surface entirely etched to remove a portion of polysilicon film PSF located on an upper surface of semiconductor substrate SUB. Furthermore, polysilicon film PSF is over-etched. Thus, as shown in FIG. 23, an upper surface of polysilicon film PSF remaining in trench TRC is lower in level than a surface of semiconductor substrate SUB.

Furthermore, in doing so, polysilicon film PSF introduced in trench TRCW having a larger width is etched at a faster rate than polysilicon film PSF introduced in trench TRC having a smaller width. Accordingly, this allows a single etching step to be done to make the position of the upper surface of polysilicon film PSF remaining in trench TRCW lower in level than the position of the upper surface of polysilicon film PSF remaining in trench TRC.

Note that in that case, by forming a photoresist pattern, polysilicon film PSF remaining in trench TRCW and polysilicon film PSF remaining in trench TRC may separately be etched.

Subsequently, steps similar to those shown in FIGS. 9-13 are performed, and, as shown in FIG. 21, contact opening portion COP is formed to penetrate contact interlayer insulating film CIL. Emitter electrode EEL is exposed at a bottom surface of contact opening portion COP and source diffusion layer SDR and base diffusion layer BDR are exposed at a side surface of contact opening portion COP.

Figure 25:
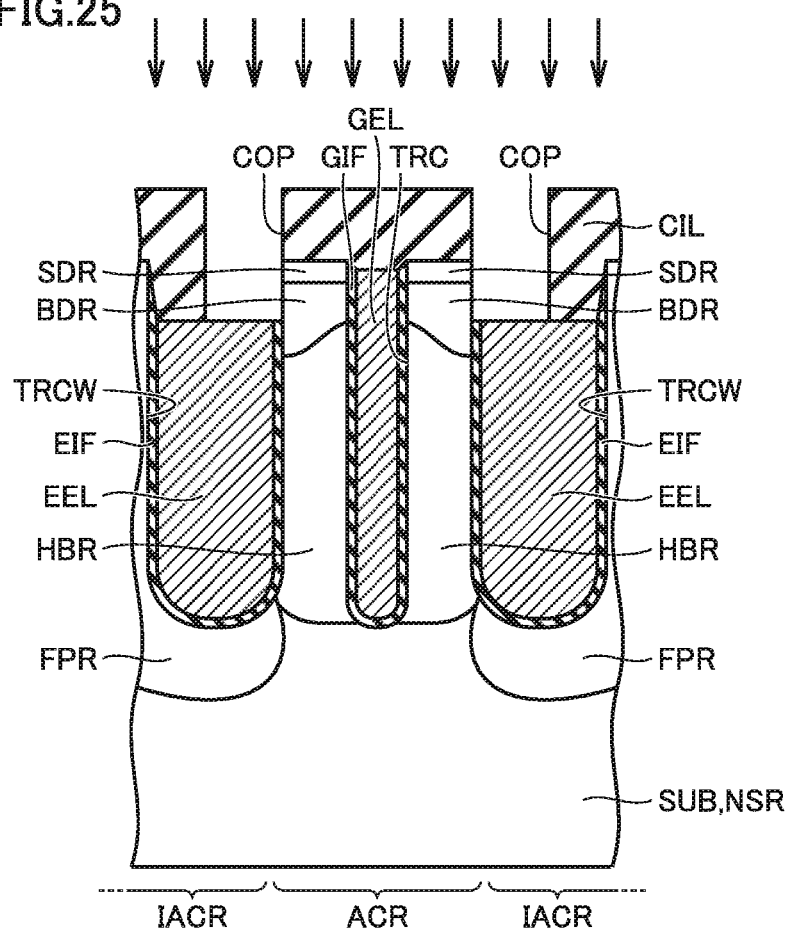
FIG. 25 is a cross section showing a step in the same embodiment performed after the step shown in FIG. 24.

Subsequently, as shown in FIG. 25, a p type impurity is implanted in base diffusion layer BDR by using as an implanting mask contact interlayer insulating film CIL in which contact opening portion COP is formed. In doing so, the p type impurity is implanted from contact opening portion COP, and accordingly, in base diffusion layer BDR, a portion thereof adjacent to emitter electrode EEL is formed to a position deeper than a portion thereof adjacent to gate electrode GEL. Base diffusion layer BDR will thus have a base bottom portion inclined in such a manner that a portion of the base bottom portion adjacent to emitter electrode EEL is positionally deeper than a portion of the base bottom portion adjacent to gate electrode GEL.

Figure 26:
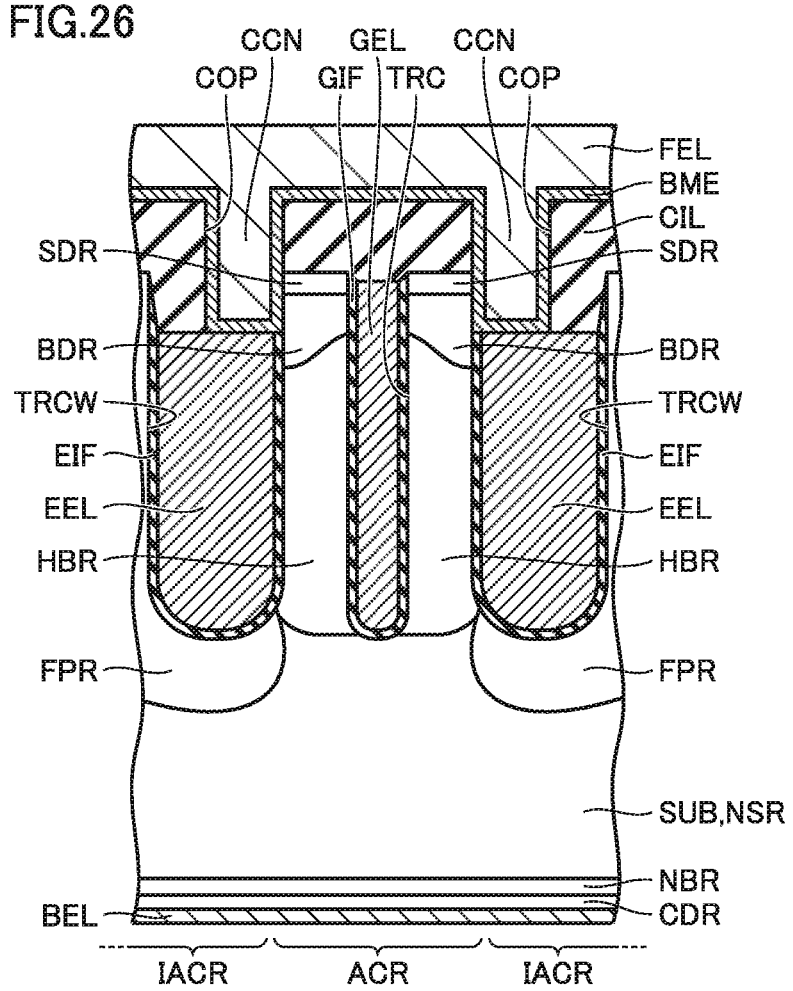
FIG. 26 is a cross section showing a step in the same embodiment performed after the step shown in FIG. 25.

Subsequently, as shown in FIG. 26, barrier metal film BME is formed on contact interlayer insulating film CIL to cover an internal wall surface of contact opening portion COP. Subsequently, an aluminum film is formed to cover barrier metal film BME in a manner filling contact opening portion COP. Contact portion CCN is formed by a portion of barrier metal film BME and a portion of the aluminum film that fill contact opening portion COP. Furthermore, metal emitter electrode MEE electrically connected to contact portion CCN is formed.

In contrast, N type buffer layer NBR and p type collector diffusion layer CDR are formed at the other surface of semiconductor substrate SUB. Subsequently, back electrode BEL in contact with collector diffusion layer CDR is formed and a major portion of the semiconductor device shown in FIG. 19 and FIG. 20 is completed.

In the above semiconductor device, emitter electrode EEL is larger in width than gate electrode GEL, and contact portion CCN has a bottom surface entirely in contact with emitter electrode EEL. This will be equivalent to a structure where emitter electrode EEL in the semiconductor device according to the first embodiment is made to further approach the gate electrode GEL. This will further reduce mesa width MW between emitter electrode EEL and gate electrode GEL (method A). As a result, the IE effect can further be enhanced.

Furthermore, as has been previously discussed, base diffusion layer BDR can have a side thereof adjacent to gate electrode GEL formed to be shallow in accordance with the inclination of the bottom portion of contact opening portion COP, and length LG from a portion of a bottom portion of base diffusion layer BDR adjacent to gate electrode GEL to a lower end of gate electrode GEL can be made larger (see FIG. 20, method B). This can contribute to enhancement of the IE effect.

Furthermore, emitter electrode EEL larger in width than gate electrode GEL allows an increased degree of freedom in size of contact opening portion COP in which contact portion CCN is formed. This allows contact opening portion COP to have a reduced aspect ratio (depth/bottom in size), and can improve barrier metal film BME's coverage and also ensures that an aluminum film to serve as contact portion CCN is introduced.

Third Embodiment

As a semiconductor device comprising an IE type trench gate IGBT according to a third embodiment, a semiconductor device in which the emitter electrode is formed in the inactive region will be described.

Figure 27:
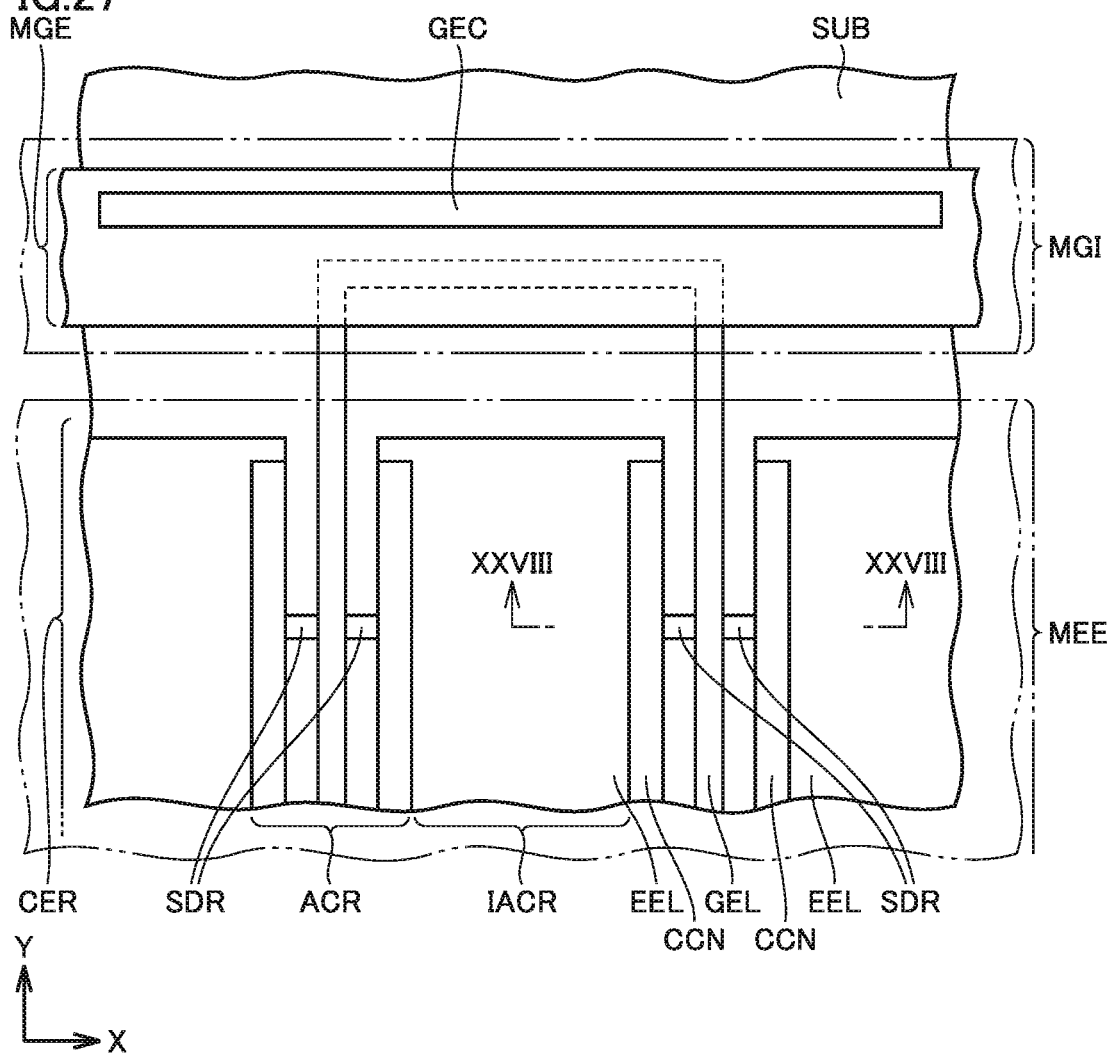
FIG. 27 is a partial plan view of a semiconductor device according to a third embodiment.
Figure 28:
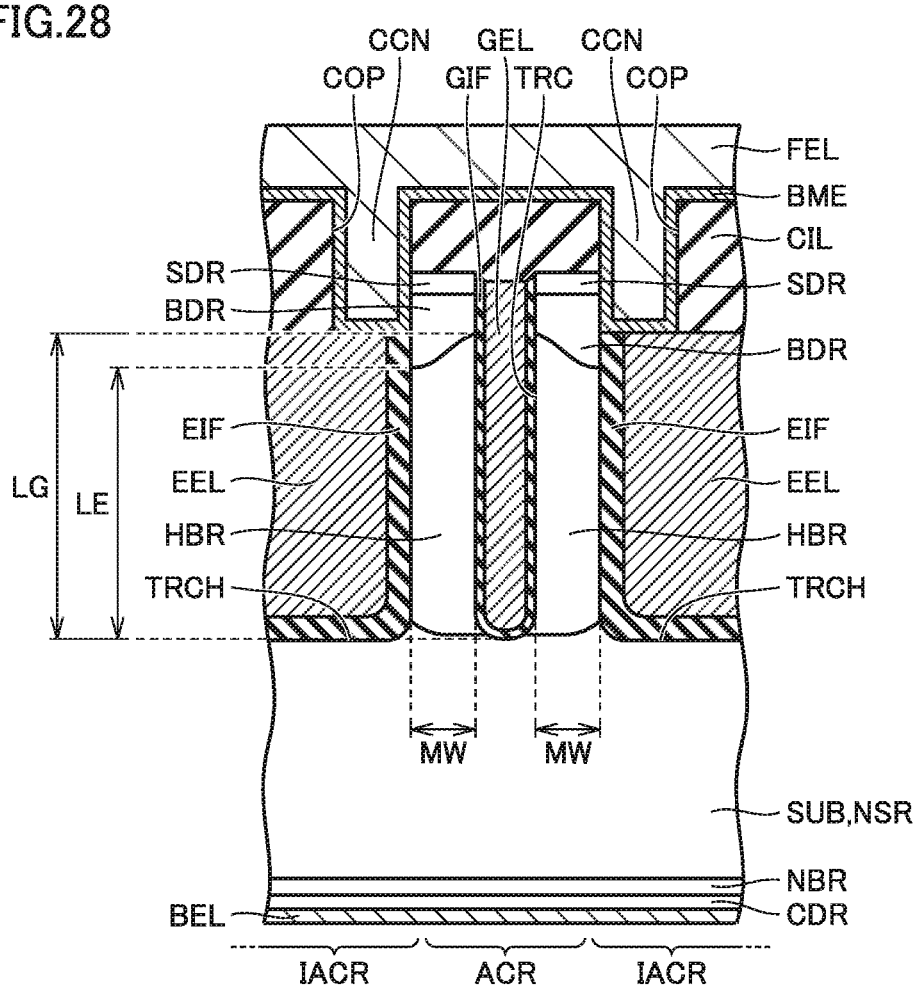
FIG. 28 is a cross section taken along a cross sectional line XXVIII-XXVIII shown in FIG. 27 in the same embodiment.

As shown in FIG. 27 and FIG. 28, in active region ACR, gate electrode GEL is disposed to extend in the y direction. Gate electrode GEL is formed in trench TRC with gate insulating film GIF interposed.

Emitter electrode EEL is disposed such that it is spaced from gate electrode GEL by a distance in the x direction with active region ACR (a region of semiconductor substrate SUB) interposed and is thus disposed opposite to gate electrode GEL. Emitter electrode EEL is formed throughout inactive region IACR. Emitter electrode EEL is formed in a trench TRCH with emitter insulating film EIF interposed. Emitter insulating film EIF is formed to be larger in thickness than gate insulating film GIF to ensure withstand voltage.

Common contact portion CCN has a contact bottom portion in contact with emitter electrode EEL. Furthermore, common contact portion CCM has a contact side portion in contact with source diffusion layer SDR and base diffusion layer BDR. An upper surface of emitter electrode EEL is lower in level than an upper surface of gate electrode GEL. Note that a remainder in configuration is similar to a configuration of the semiconductor device shown in FIGS. 1-3, and accordingly, any identical member is identically denoted and will not be described redundantly unless necessary.

Figure 29:
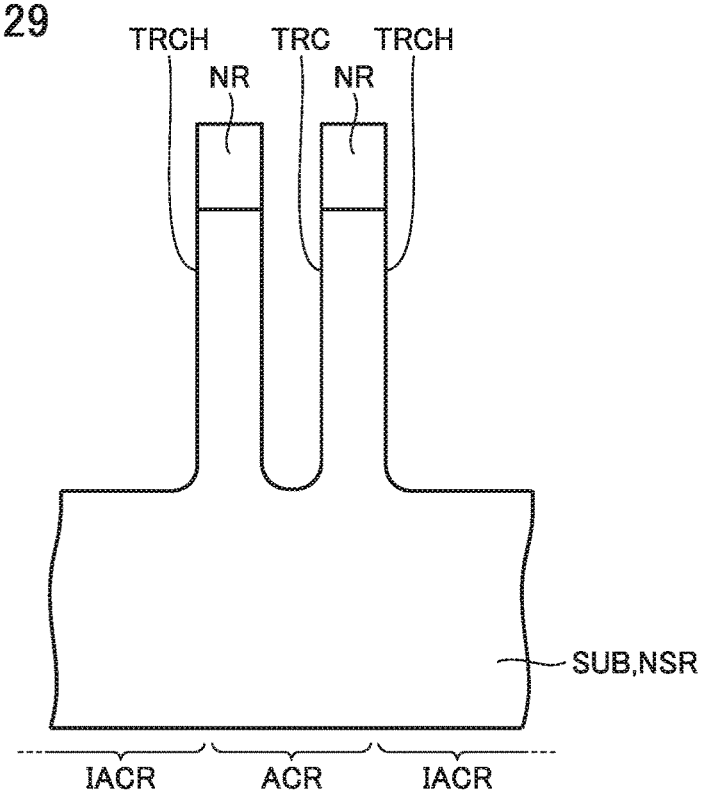
FIG. 29 is a cross section showing a step of a method for producing a semiconductor device in the same embodiment.

Hereinafter, an example of a method for producing the semiconductor device described above will be described. After steps similar to those shown in FIG. 5 and FIG. 6 are performed, then, as shown in FIG. 29, trench TRC and a trench TRCH of a prescribed depth are formed in semiconductor substrate SUB. Trench TRCH in which an emitter electrode is to be formed is formed throughout inactive region IACR.

Figure 30:
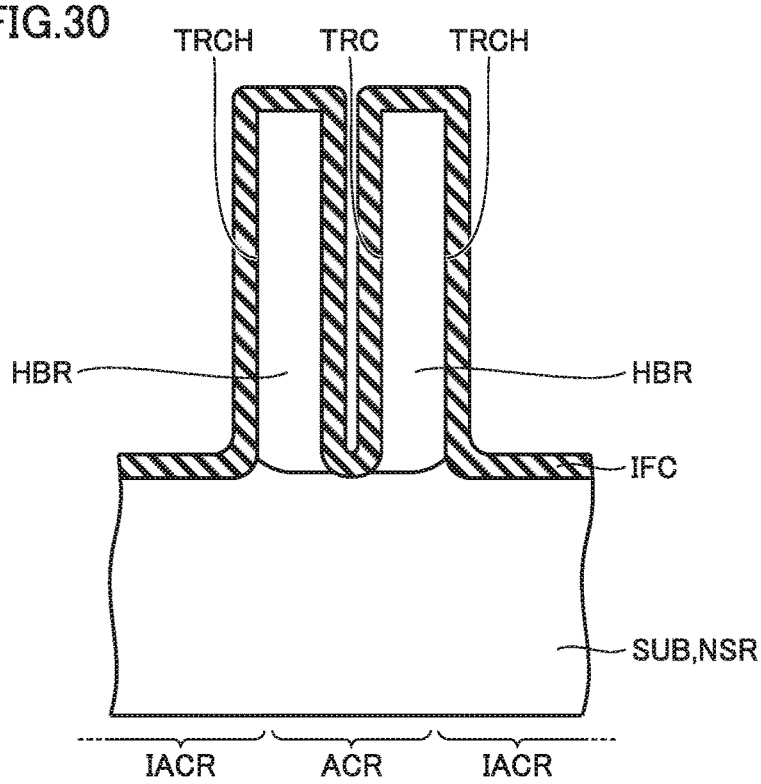
FIG. 30 is a cross section showing a step in the same embodiment performed after the step shown in FIG. 29.

Subsequently, as shown in FIG. 30, a thermal oxidation process is performed to form a relatively thick insulating film IFC on a surface of semiconductor substrate SUB including an internal wall surface of trench TRC and that of trench TRCH. Subsequently, a prescribed photomechanical process is performed to form a photoresist pattern (not shown) which exposes insulating film IFC formed in trench TRC and covers insulating film IFC located in trench TRCH.

Subsequently, by using the photoresist pattern as an etching mask, etching is performed to remove insulating film IFC formed in trench TRC to expose semiconductor substrate SUB.

Figure 31:
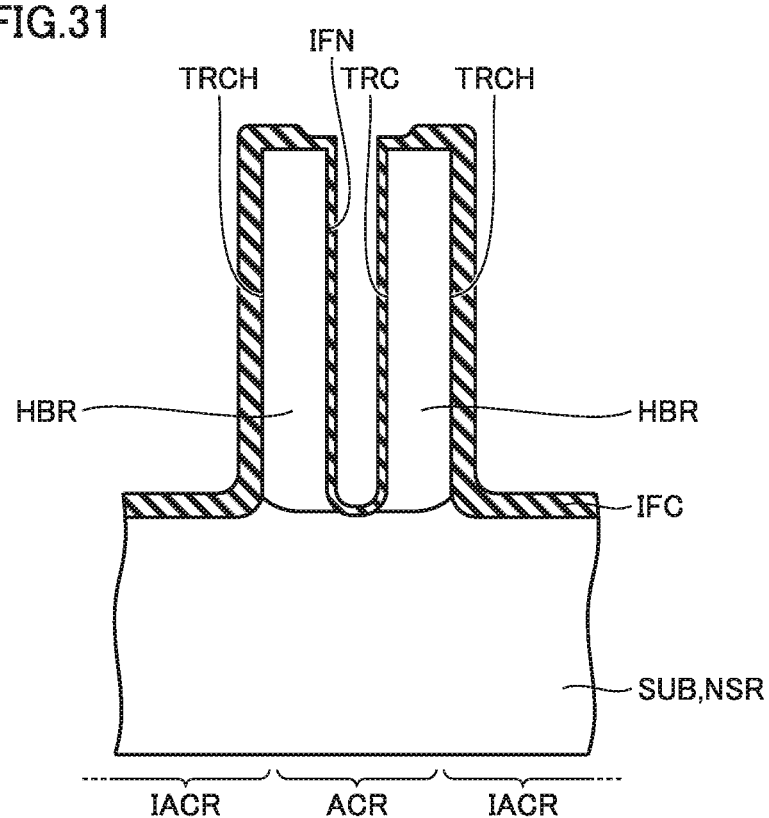
FIG. 31 is a cross section showing a step in the same embodiment performed after the step shown in FIG. 30.

Subsequently, as shown in FIG. 31, a thermal oxidation process is performed to form a relatively thin insulating film IFN on a surface of semiconductor substrate SUB exposed in trench TRC. Relatively thin insulating film IFN will serve as a gate insulating film and relatively thick insulating film IFC will serve as an emitter insulating film.

Figure 32:
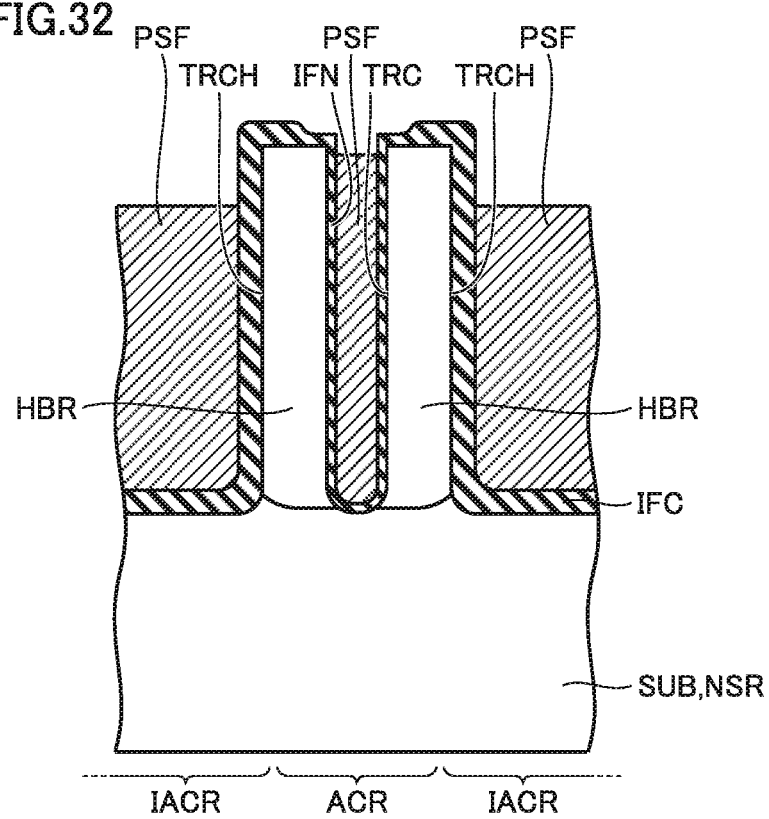
FIG. 32 is a cross section showing a step in the same embodiment performed after the step shown in FIG. 31.

Subsequently, a polysilicon film (not shown) is formed in a manner filling trench TRC and trench TRCH. Subsequently, the polysilicon film has a surface entirely etched to remove a portion of the polysilicon film located on an upper surface of semiconductor substrate SUB. Furthermore, the polysilicon film is over-etched. Thus, as shown in FIG. 32, an upper surface of the polysilicon film remaining in trench TRC is lower in level than a surface of semiconductor substrate SUB.

In doing so, polysilicon film PSF filling trench TRCH formed throughout inactive region IACR is etched at a faster rate than polysilicon film PSF filling trench TRC. This allows a single etching step to be done to make the position of the upper surface of polysilicon film PSF remaining in trench TRCH lower in level than the position of the upper surface of polysilicon film PSF remaining in trench TRC.

Figure 33:
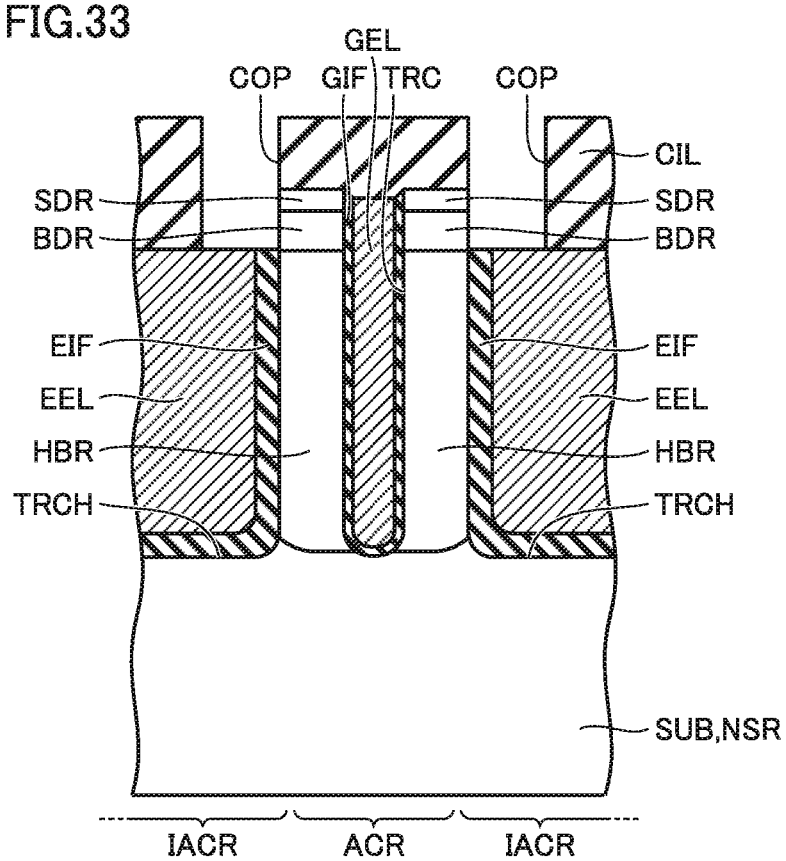
FIG. 33 is a cross section showing a step in the same embodiment performed after the step shown in FIG. 32.

Subsequently, steps similar to those shown in FIGS. 9-13 are performed, and, as shown in FIG. 33, contact opening portion COP is formed to penetrate contact interlayer insulating film CIL. Emitter electrode EEL is exposed at a bottom surface of contact opening portion COP and source diffusion layer SDR and base diffusion layer BDR are exposed at a side surface of contact opening portion COP.

Subsequently, as shown in FIG. 34, a p type impurity is implanted in base diffusion layer BDR by using as an implanting mask contact interlayer insulating film CIL in which contact opening portion COP is formed. In doing so, the p type impurity is implanted from contact opening portion COP, and accordingly, in base diffusion layer BDR, a portion thereof adjacent to emitter electrode EEL is formed to a position deeper than a portion thereof adjacent to gate electrode GEL. Base diffusion layer BDR will thus have a base bottom portion inclined in such a manner that a portion of the base bottom portion adjacent to emitter electrode EEL is positionally deeper than a portion of the base bottom portion adjacent to gate electrode GEL.

Subsequently, as shown in FIG. 35, barrier metal film BME is formed on contact interlayer insulating film CIL to cover an internal wall surface of contact opening portion COP. Subsequently, an aluminum film is formed to cover barrier metal film BME in a manner filling contact opening portion COP. Contact portion CCN is formed by a portion of barrier metal film BME and a portion of the aluminum film that fill contact opening portion COP. Furthermore, metal emitter electrode MEE electrically connected to contact portion CCN is formed.

In contrast, N type buffer layer NBR and p type collector diffusion layer CDR are formed at the other surface of semiconductor substrate SUB. Subsequently, back electrode BEL in contact with collector diffusion layer CDR is formed and a major portion of the semiconductor device shown in FIG. 27 and FIG. 28 is completed.

The above described semiconductor device, as well as a further previously described semiconductor device, will have mesa width MW between emitter electrode EEL and gate electrode GEL further reduced (method A). As a result, the IE effect can further be enhanced. Furthermore, base diffusion layer BDR can have a side thereof adjacent to gate electrode GEL formed to be shallow in accordance with the inclination of the bottom portion of contact opening portion COP, and length LG from a portion of a bottom portion of base diffusion layer BDR adjacent to gate electrode GEL to a lower end of gate electrode GEL can be made larger (see FIG. 28, method B). This can contribute to enhancement of the IE effect.

Furthermore, the semiconductor device according to the third embodiment can achieve the following effect: First of all, emitter electrode EEL is formed throughout inactive region IACR. This eliminates the necessary of forming a floating diffusion layer in inactive region INACR.

Furthermore, holes injected from collector diffusion layer CDR will not be accumulated in the floating diffusion layer and will be accumulated in N type region NSR. As there is no hole accumulated in the floating diffusion layer, the IGBT can accordingly be turned off faster.

Furthermore, as the floating diffusion layer is not formed, an electric field at an OFF time would be significantly strong. To address this, emitter insulating film EIF interposed between emitter electrode EEL and trench TRCH can be made larger in thickness than gate insulating film GIF to ensure withstand voltage at the OFF time. In particular, the withstand voltage can be ensured against electric field concentration at a corner of the trench.

Note that the semiconductor devices and their production methods described in the embodiments can be combined variously as required.

While the invention made by the present inventor has specifically been described based on embodiments, the present invention is not limited to the above embodiments and it is needless to say that the present invention can be modified variously within a range which does not depart from its gist.

The above described second and third embodiments include the following aspects:

(Supplementary Note 1)

A method for producing a semiconductor device comprising a trench gate bipolar transistor, comprising the steps of:

defining a first region (ACR) and a second region (IACR) adjacent to each other in a semiconductor substrate (SUB) of a first conductivity type having a first surface;

forming a first trench (TRC) that extends from the first surface of the semiconductor substrate (SUB) located in the first region (ACR) to a first depth and has a first width, and also forming a second trench (TRC) that is spaced from the first trench (TRC), extends from the first surface of the semiconductor substrate (SUB) to the first depth and has a second width larger than the first width;

forming a gate electrode (GEL) in the first trench (TRC) with a first insulating film (GIF) interposed, and forming an emitter electrode (EEL) in the second trench (TRC) with a second insulating film (EIF) interposed, the emitter electrode (EEL) having an upper end lower in level than an upper end of the gate electrode (GEL);

introducing an impurity of a second conductivity type into the second region (IACR) to form a floating diffusion layer (FPR);

forming a source region (SDR) of the first conductivity type from the first surface of the semiconductor substrate (SUB) located between the gate electrode (GEL) and the emitter electrode (EEL) to a second depth;

forming a base region (BDR) of the second conductivity type from the second depth of the semiconductor substrate (SUB) between the gate electrode (GEL) and the emitter electrode (EEL) to a position deeper than the second depth and shallower than the first depth;

forming a contact interlayer insulating film (CIL) to cover the first region (ACR) and the second region (IACR);

etching the contact interlayer insulating film (CIL) to form a contact opening portion (COP) having a bottom surface exposing the emitter electrode (EEL) and a side surface exposing the source region (SDR) and base region (BDR); and forming in the contact opening portion (COP) a contact portion (CCN) having a contact bottom portion and a contact side portion such that the contact bottom portion is in contact with the emitter electrode (EEL) and the contact side portion is in contact with the base region (BDR) and the source region (SDR).

(Supplementary Note 2)

The method for producing a semiconductor device according to Supplementary Note 1, wherein the step of forming the base region (BDR) includes the step of implanting and thermally diffusing an impurity of the second conductivity type into the base region (BDR) via the contact opening portion (COP) to incline a base bottom portion of the base region (BDR) in such a manner that a first portion of the base bottom portion of the base region (BDR) adjacent to the gate electrode (GEL) is deeper than a second portion of the base bottom portion of the base region (BDR) adjacent to the emitter electrode (EEL).

(Supplementary Note 3)

The method for producing a semiconductor device according to Supplementary Note 1, wherein the step of forming the gate electrode (GEL) and the emitter electrode (EEL) includes the steps of:

forming a conductive film to cover the semiconductor substrate (SUB) in a manner filling the first trench (TRC) and the second trench (TRC);

etching an entire surface of the conductive film to remove a portion of the conductive film located on the first surface of the semiconductor substrate (SUB) to allow a position of an upper surface of a portion of the conductive film remaining in each of the first trench (TRC) and the second trench (TRC) to be lower in level than a position of the first surface of the semiconductor substrate (SUB); and making the position of the upper surface of the portion of the conductive film remaining in the second trench (TRC) lower in level than the position of the upper surface of the portion of the conductive film remaining in the first trench (TRC).

(Supplementary Note 4)

A method for producing a semiconductor device comprising a trench gate bipolar transistor, comprising the steps of:

defining a first region (ACR) and a second region (IACR) adjacent to each other in a semiconductor substrate (SUB) of a first conductivity type having a first surface;

forming a first trench (TRC) that extends from the first surface of the semiconductor substrate (SUB) located in the first region (ACR) to a first depth and has a first width, and also forming a second trench (TRC) that is spaced from the first trench (TRC), extends from the first surface of the semiconductor substrate (SUB) located in the second region (IACR) to the first depth throughout the second region (IACR);

forming in the first trench (TRC) a first insulating film (GIF) having a first thickness, and forming in the second trench (TRC) a second insulating film (EIF) having a second thickness larger than the first thickness;

forming a gate electrode (GEL) in the first trench (TRC) with the first insulating film (GIF) interposed, and forming an emitter electrode (EEL) in the second trench (TRC) with the second insulating film (EIF) interposed, the emitter electrode (EEL) having an upper end lower in level than an upper end of the gate electrode (GEL);

forming a source region (SDR) of the first conductivity type from the first surface of the semiconductor substrate (SUB) located in the first region (ACR) between the gate electrode (GEL) and the emitter electrode (EEL) to a second depth;

forming a base region (BDR) of a second conductivity type from the second depth of the semiconductor substrate (SUB) located in the first region (ACR) between the gate electrode (GEL) and the emitter electrode (EEL) to a position deeper than the second depth and shallower than the first depth;

forming a contact interlayer insulating film (CIL) to cover the first region (ACR) and the second region (IACR);

etching the contact interlayer insulating film (CIL) to form a contact opening portion (COP) having a bottom surface exposing the emitter electrode (EEL) and a side surface exposing the source region (SDR) and the base region (BDR); and forming in the contact opening portion (COP) a contact portion (CCN) having a contact bottom portion and a contact side portion such that the contact bottom portion is in contact with the emitter electrode (EEL) and the contact side portion is in contact with the base region (BDR) and the source region (SDR).

(Supplementary Note 5)

The method for producing a semiconductor device according to Supplementary Note 4, wherein the step of forming the base region (BDR) includes the step of implanting and thermally diffusing an impurity of the second conductivity type into the base region (BDR) via the contact opening portion (COP) to incline a base bottom portion of the base region (BDR) in such a manner that a first portion of the base bottom portion of the base region (BDR) adjacent to the gate electrode (GEL) is positionally deeper than a second portion of the base bottom portion of the base region (BDR) adjacent to the emitter electrode (EEL).

(Supplementary Note 6)

The method for producing a semiconductor device according to Supplementary Note 4, wherein the step of forming the gate electrode (GEL) and the emitter electrode (EEL) includes the steps of:

forming a conductive film to cover the semiconductor substrate (SUB) in a manner filling the first trench (TRC) and the second trench (TRC);

etching an entire surface of the conductive film to remove a portion of the conductive film located on the first surface of the semiconductor substrate (SUB) to allow a position of an upper surface of a portion of the conductive film remaining in each of the first trench (TRC) and the second trench (TRC) to be lower in level than a position the first surface of the semiconductor substrate (SUB); and making the position of the upper surface of the portion of the conductive film remaining in the second trench (TRC) lower in level than the position of the upper surface of the portion of the conductive film remaining in the first trench (TRC).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising a trench gate bipolar transistor, comprising:

a semiconductor substrate of a first conductivity type having a first surface;

a first region and a second region defined in the semiconductor substrate adjacent to each other;

a gate electrode formed in a first trench extending from the first surface of the semiconductor substrate located in the first region to a first depth, with a first insulating film interposed;

an emitter electrode formed in a second trench extending from the first surface to the first depth, with a second insulating film interposed, such that the emitter electrode is spaced from the gate electrode in such a manner that a region of the semiconductor substrate located in the first region is interposed;

a source region of the first conductivity type formed from the first surface of the semiconductor substrate located in the first region between the gate electrode and the emitter electrode to a second depth shallower than the first depth;

a base region of a second conductivity type formed from the second depth of the semiconductor substrate located in the first region between the gate electrode and the emitter electrode to a position deeper than the second depth and shallower than the first depth;

a floating region of the second conductivity type formed from the first surface of the semiconductor substrate located in the second region to a position deeper than the first depth; and a contact portion electrically connected to the emitter electrode, the source region, and the base region, the contact portion being formed in a manner astride the emitter electrode and the base region, the contact portion having a contact bottom portion inclined in such a manner that a first portion of the contact bottom portion in contact with the emitter electrode is positionally deeper than a second portion of the contact bottom portion in contact with the base region.

2. The semiconductor device according to claim 1, wherein:

the base region has a base bottom portion inclined in such a manner that a first portion of the base bottom portion adjacent to the emitter electrode is positionally deeper than a second portion of the base bottom portion adjacent to the gate electrode; and a length from the second portion of the base bottom portion to a lower end of the gate electrode is longer than a length from the first portion of the base bottom portion to the lower end of the gate electrode.

3. The semiconductor device according to claim 1, wherein:

the contact portion has the contact bottom portion in contact with the emitter electrode and the base region; and the contact portion has a contact side portion in contact with the source region and the base region.

4. A semiconductor device comprising a trench gate bipolar transistor, comprising:

a semiconductor substrate of a first conductivity type having a first surface;

a first region and a second region defined in the semiconductor substrate adjacent to each other;

a gate electrode formed in a first trench extending from the first surface of the semiconductor substrate located in the first region to a first depth, with a first insulating film interposed;

a source region of the first conductivity type formed from the first surface of the semiconductor substrate located between the gate electrode and the second region to a second depth shallower than the first depth;

a base region of a second conductivity type formed from the second depth of the semiconductor substrate located between the gate electrode and the second region to a position deeper than the second depth;

a carrier passage preventing portion including an emitter electrode and preventing a carrier from flowing therethrough, the carrier passage preventing portion being formed in a region of the semiconductor substrate located in the second region such that the carrier passage preventing portion is spaced from the gate electrode in such a manner that a region of the semiconductor substrate located in the first region is interposed; and a contact portion electrically connected to the emitter electrode, the source region, and the base region, the contact portion having a bottom portion in contact with the emitter electrode, the contact portion having a contact side portion in contact with the source region and the base region, wherein:

the carrier passage preventing portion includes the emitter electrode and a floating region of a second conductivity type;

the emitter electrode is formed in a second trench extending from the first surface to the first depth, with a second insulating film interposed, such that the emitter electrode is spaced from the gate electrode in such a manner that a region of the semiconductor substrate located in the first region is interposed; and the floating region is formed from the first surface of the semiconductor substrate located in the second region to a position deeper than the first depth, and wherein:

the base region has a base bottom portion inclined in such a manner that a first portion of the base bottom portion adjacent to the emitter electrode is positionally deeper than a second portion of the base bottom portion adjacent to the gate electrode; and a length from the second portion of the base bottom portion to a lower end of the gate electrode is longer than a length from the first portion of the base bottom portion to the lower end of the gate electrode.

5. The semiconductor device according to claim 4, wherein an upper end of the emitter electrode is lower in level than an upper end of the gate electrode.

6. The semiconductor device according to claim 4, wherein the emitter electrode is larger in width than the gate electrode.

7. The semiconductor device according to claim 4, wherein:

the carrier passage preventing portion is the emitter electrode; and the emitter electrode is formed in a second trench extending from the first surface of the semiconductor substrate located throughout the second region to the first depth, with a second insulating film interposed.

8. The semiconductor device according to claim 7, wherein an upper end of the emitter electrode is lower in level than an upper end of the gate electrode.

9. A semiconductor device comprising a trench gate bipolar transistor, comprising:

a semiconductor substrate of a first conductivity type having a first surface;

a first region and a second region defined in the semiconductor substrate adjacent to each other;

a gate electrode formed in a first trench extending from the first surface of the semiconductor substrate located in the first region to a first depth, with a first insulating film interposed;

a source region of the first conductivity type formed from the first surface of the semiconductor substrate located between the gate electrode and the second region to a second depth shallower than the first depth;

a base region of a second conductivity type formed from the second depth of the semiconductor substrate located between the gate electrode and the second region to a position deeper than the second depth;

a carrier passage preventing portion including an emitter electrode and preventing a carrier from flowing therethrough, the carrier passage preventing portion being formed in a region of the semiconductor substrate located in the second region such that the carrier passage preventing portion is spaced from the gate electrode in such a manner that a region of the semiconductor substrate located in the first region is interposed; and a contact portion electrically connected to the emitter electrode, the source region, and the base region, the contact portion having a bottom portion in contact with the emitter electrode, the contact portion having a contact side portion in contact with the source region and the base region, wherein:

the carrier passage preventing portion is the emitter electrode; and the emitter electrode is formed in a second trench extending from the first surface of the semiconductor substrate located throughout the second region to the first depth, with a second insulating film interposed, and wherein:

the base region has a base bottom portion inclined in such a manner that a first portion of the base bottom portion adjacent to the emitter electrode is positionally deeper than a second portion of the base bottom portion adjacent to the gate electrode; and a length from the second portion of the base bottom portion to a lower end of the gate electrode is longer than a length from the first portion of the base bottom portion to the lower end of the gate electrode.

\* \* \* \* \*